United States Patent [19]

Okada

[11] Patent Number: 5,889,481
[45] Date of Patent: Mar. 30, 1999

[54] CHARACTER COMPRESSION AND DECOMPRESSION DEVICE CAPABLE OF HANDLING A PLURALITY OF DIFFERENT LANGUAGES IN A SINGLE TEXT

[75] Inventor: Yoshiyuki Okada, Kawasaki, Japan

[73] Assignee: Fujitsu Limited, Kawasaki, Japan

[21] Appl. No.: 682,428

[22] Filed: Jul. 17, 1996

[30] Foreign Application Priority Data

Feb. 9, 1996 [JP] Japan .................................. 8-023523

[51] Int. Cl.⁶ .................................................. G06F 15/66
[52] U.S. Cl. .................................. 341/51; 341/50; 704/8
[58] Field of Search .............................. 341/50, 51, 59, 341/60, 67, 87, 95, 106; 704/8, 9, 257

[56] References Cited

U.S. PATENT DOCUMENTS

| 5,374,916 | 12/1994 | Chu | 340/146.2 |
| 5,444,445 | 8/1995 | Chu | 341/87 |
| 5,523,946 | 6/1996 | Kaplan et al. | 364/419.02 |
| 5,689,616 | 11/1997 | Li | 395/2.41 |

FOREIGN PATENT DOCUMENTS 94 27374  11/1994  WIPO .............................. H03M 7/30

OTHER PUBLICATIONS

David Van Camp, Unicode and Software Globalization, Dr. Dobb's Journal, pp. 46–50, Mar. 1994.
Stern, "Gateway to the Future—Technology in Motion", *41st IEEE Vehicular Techn. Conf.*, pp. 429–432 (May 19, 1991).

*Primary Examiner*—Marc S. Hoff
*Assistant Examiner*—Peguy Jean Pierre
*Attorney, Agent, or Firm*—Staas & Halsey

[57] ABSTRACT

A compressing apparatus separates a data string inputted from source data of a Unicode in which different languages mixedly exist into a language string of each language and, after that, compresses the data string every language string. When decompressing, each language string is decompressed from the compressed data of every different language and the original data string in which a plurality of kinds of language codes mixedly exist is decompressed by using language change information obtained upon compression. In case of special language source data, for example, Japanese source data, the compression and decompression are separately executed for every different byte construction. The compression and decompression are also separately executed for every character kind in the code. Further, the compression and decompression can be also performed by unifying the byte construction.

22 Claims, 41 Drawing Sheets

FIG. 3 PRIOR ART

| INPUT DATA | : | a | b | a | b | c | b | a | b | a | b | a | a | a | a | a | a | a |
|---|---|---|---|---|---|---|---|---|---|---|---|---|---|---|---|---|---|---|

OUTPUT CODE : 1  2  4  3  5  8  1  10  11

DICTIONARY REGISTRATION :
4 6 8 9 10 11 12
5 7 8 9 10 11

FIG. 4 PRIOR ART

| REGISTRATION NO. | PARTIAL STRING | PARTIAL STRING ωK |
|---|---|---|
| 1<br>2<br>3 | a<br>b<br>c | a<br>b<br>c |
| 4<br>5<br>6<br>7<br>8<br>9<br>10<br>11<br>12 | a b<br>b a<br>a b c<br>c b<br>b a b<br>b a b a<br>a a<br>a a a<br>a a a a | 1 b<br>2 a<br>4 c<br>3 b<br>5 b<br>8 a<br>1 a<br>10 a<br>11 a |

FIG. 6 PRIOR ART

| INPUT CODE: | 1 ⇒ a | 2 ⇒ b | 4 ⇒ 1b ⇒ a | 3 ⇒ c | 5 ⇒ 2a ⇒ b | 8 ⇒ 5b ⇒ 2a ⇒ b | 1 ⇒ a | 10 ⇒ 1a ⇒ a | 11 ⇒ 10a ⇒ 1a ⇒ a |
|---|---|---|---|---|---|---|---|---|---|
| OUTPUT DATA: | a | b | ab | c | ba | bab | a | aa | aaa |
| DICTIONARY REGISTRACTION: | 4 | 5 | 6 | 7 | 8 | 9 | 10 | 11 | 12 |

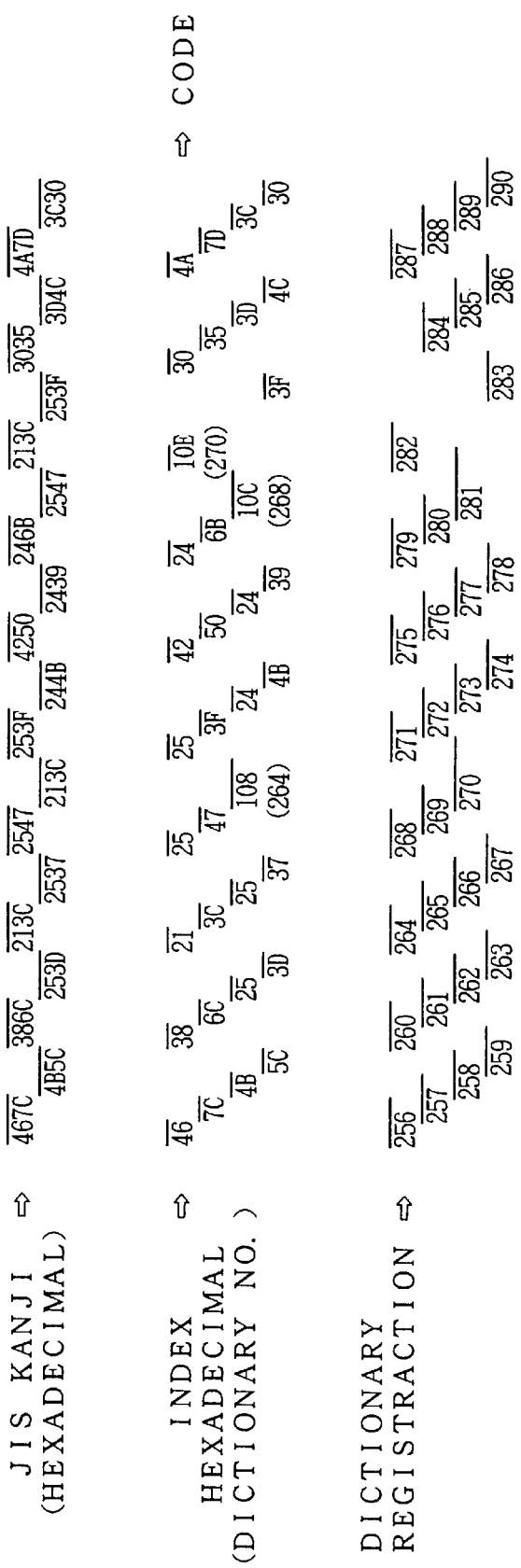

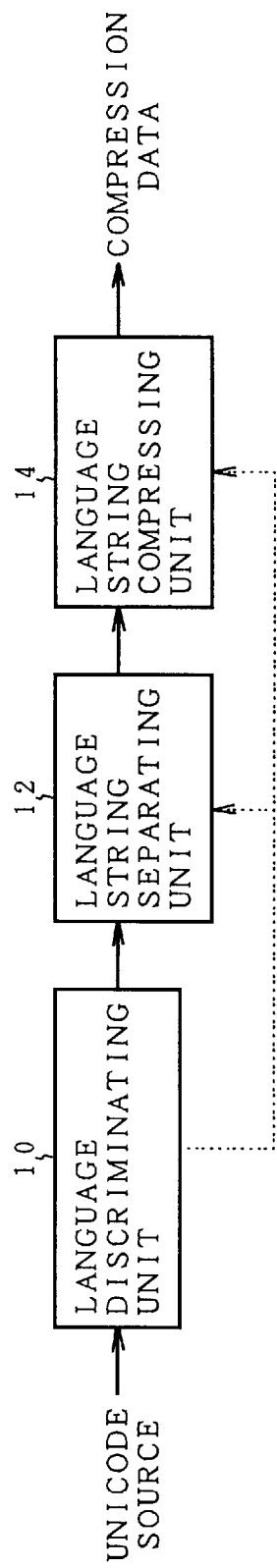
F I G. 1 1
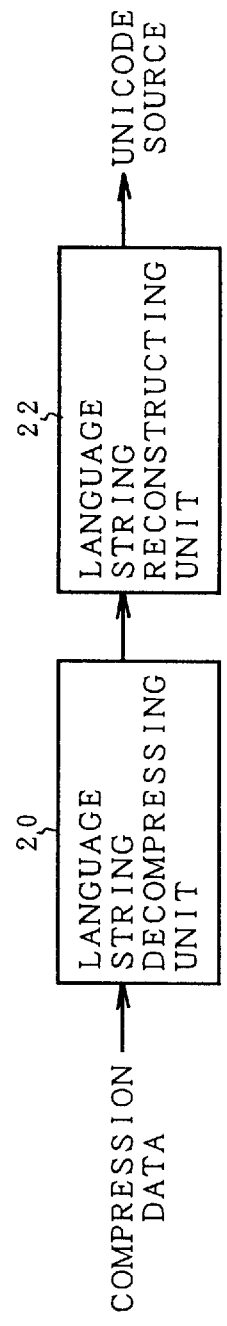
F I G. 1 2

1 OCTET = 1 BYTE

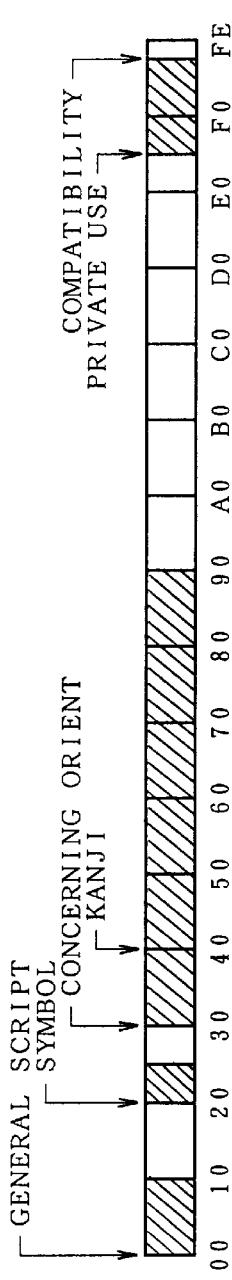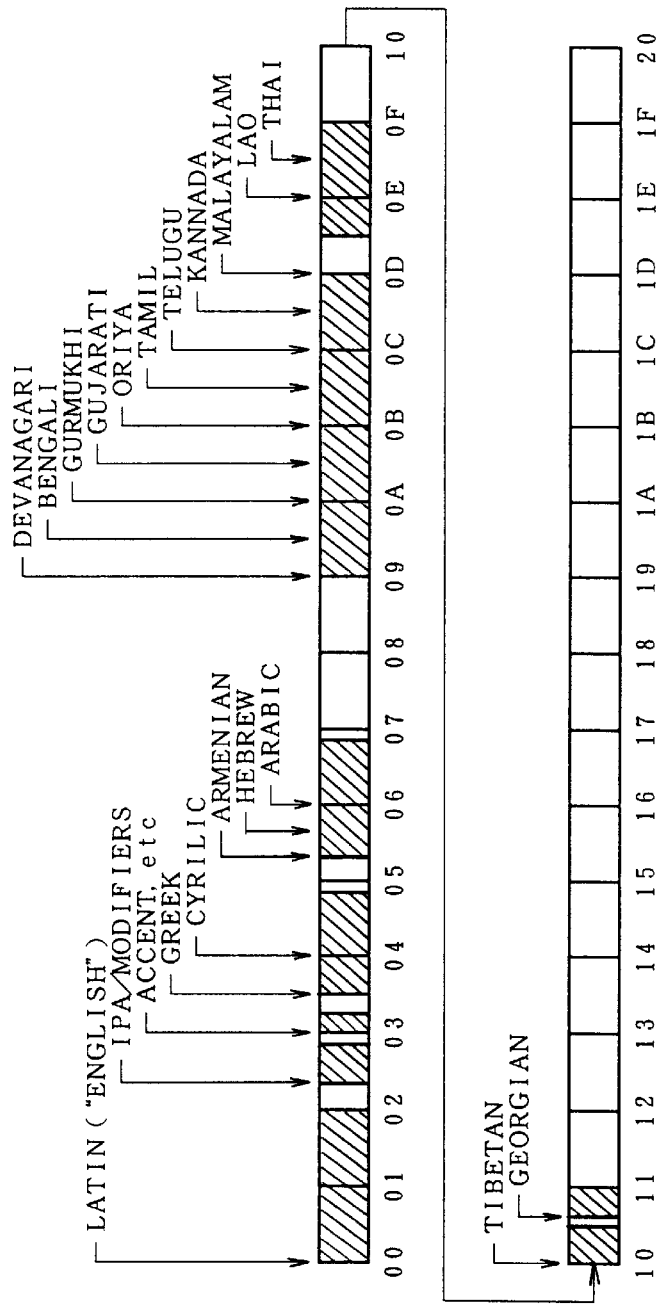
F I G. 16A  F I G. 16B  F I G. 16C

FIG. 27

| | NUMBER OF CHARACTERS | JIS KANJI | S-JIS | EUC | REMARKS |
|---|---|---|---|---|---|
| FULLWIDTH-SYMBOL | 147 | 2121~227E | 8140~81FC | A121~A27E | SPACE, COMMA, etc |
| FULLWIDTH-ALPHANUMERIC | 62 | 2330~237A | 824F~829A | A330~A37A | |
| FULLWIDTH-HIRAGANA | 83 | 2421~2473 | 829F~82F1 | A421~A473 | |
| FULLWIDTH-KATAKANA | 86 | 2521~2576 | 8340~8396 | A521~A576 | |
| FULLWIDTH-OTHERS | 146 | 2621~2771 | 839F~8491 | A621~A771 | |
| FULLWIDTH-KANJI | 6353 | 3231~737E | 889F~EA9E | B231~F37E | |
| HALFWIDTH-ALPHANUMERIC | 52 | 30~7A | 30~7A | 30~7A | |
| HALFWIDTH-KATAKANA | 57 | B1~DF | B1~DF | B1~DF | |
| HALFWIDTH-SYMBOL | 30 | 20~2F | 20~2F | 20~2F | SPACE, COMMA, etc |
| HALFWIDTH-OTHERS | 32 | 00~1F | 00~1F | 00~1F | |

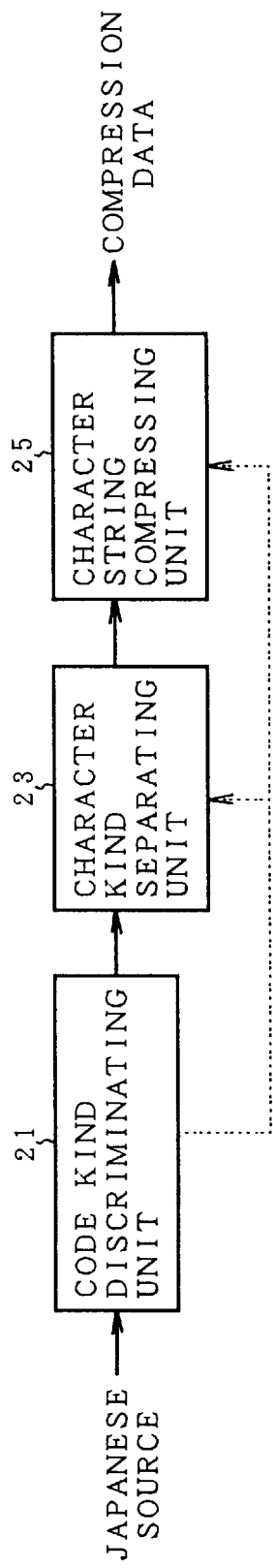
F I G. 3 1
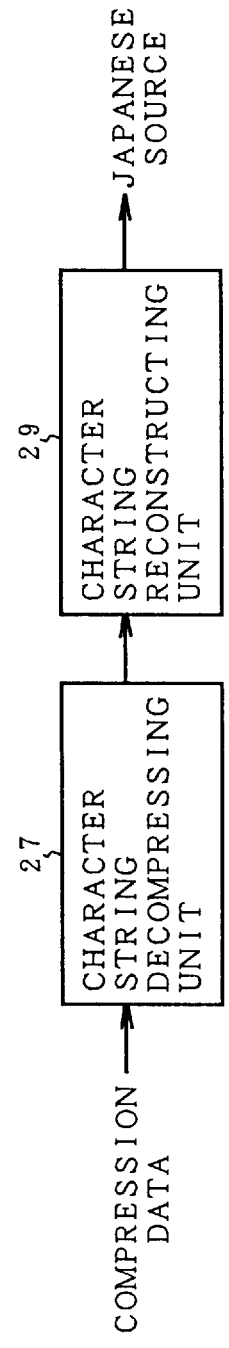
F I G. 3 2

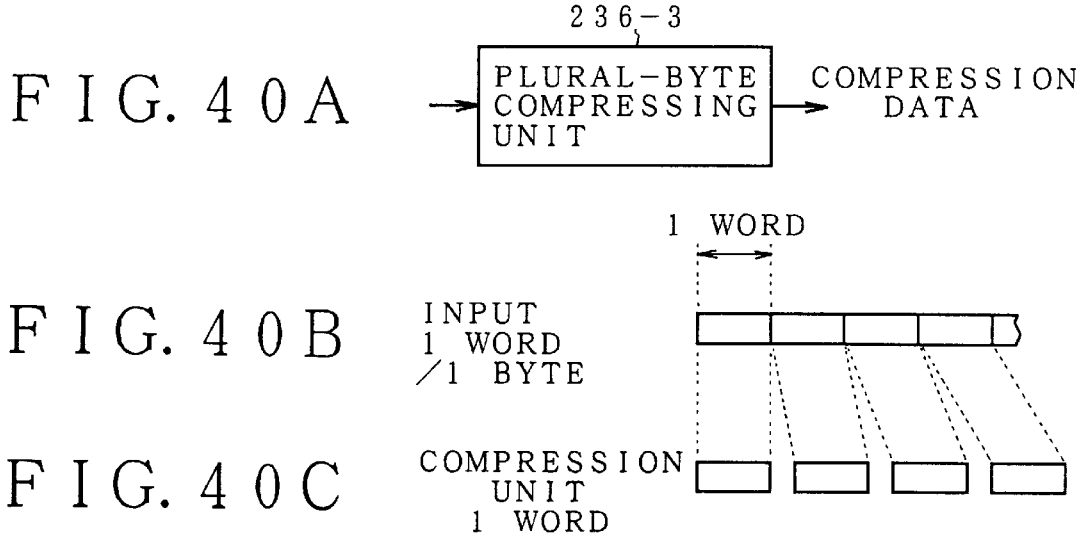
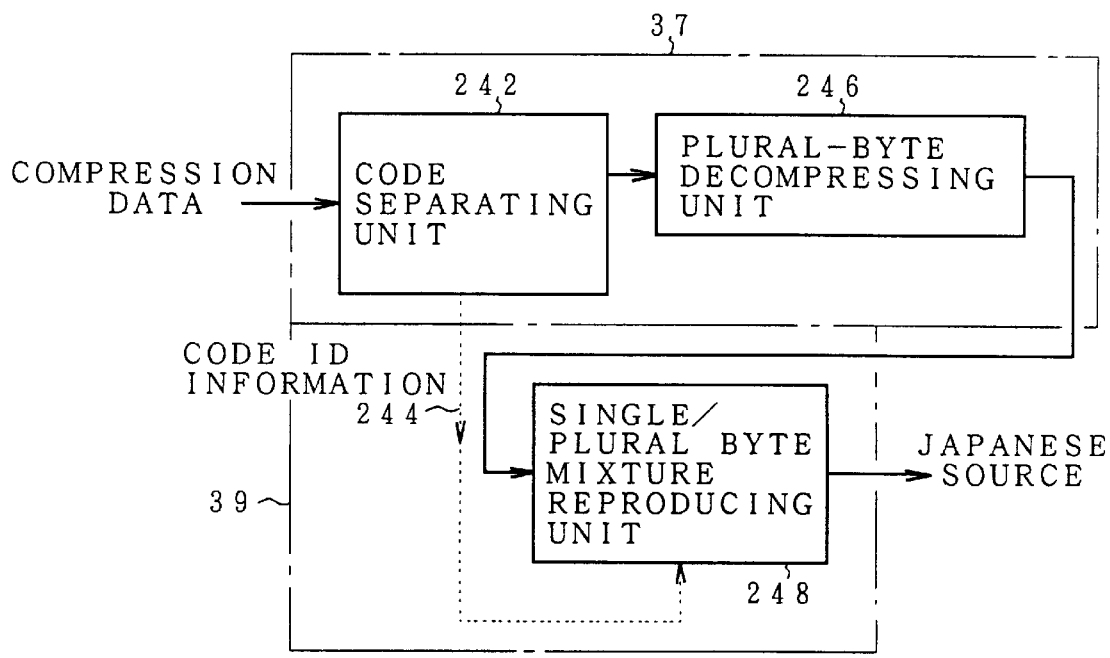

FIG. 42A
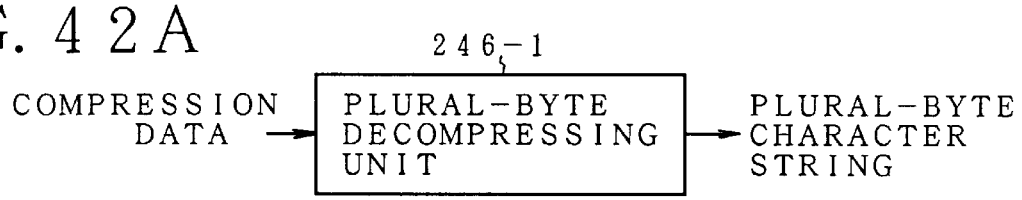
FIG. 42B
FIG. 42C
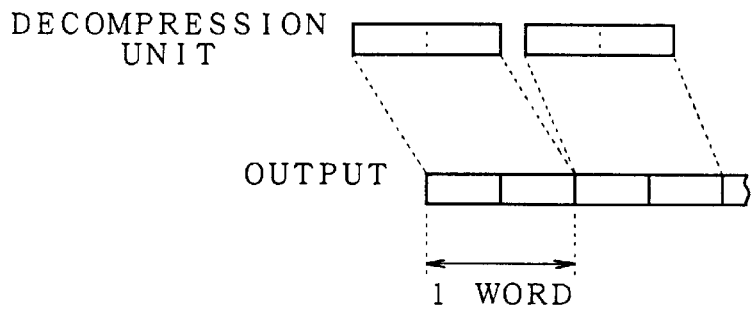
FIG. 43A
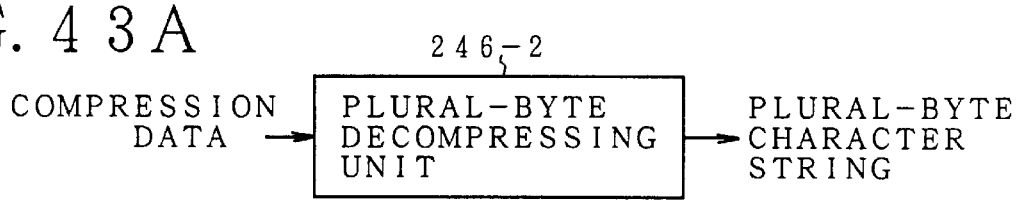
FIG. 43B
FIG. 43C
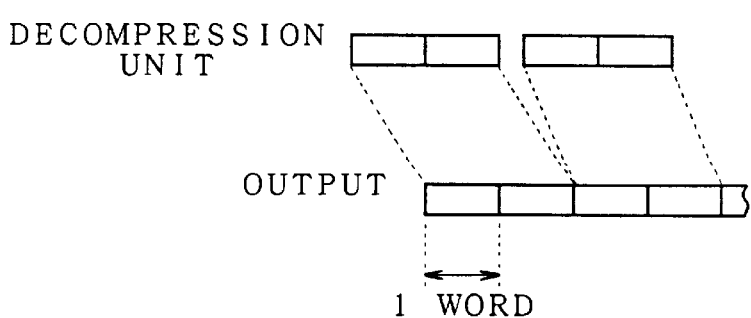

FIG. 44A
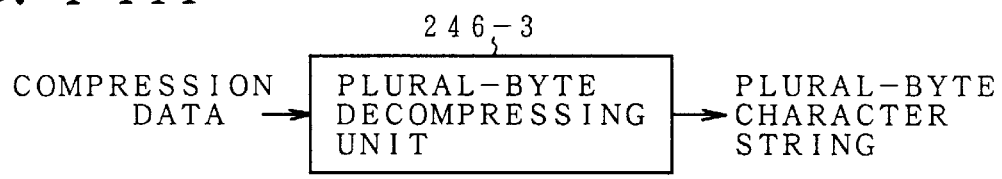
COMPRESSION DATA → PLURAL-BYTE DECOMPRESSING UNIT 246-3 → PLURAL-BYTE CHARACTER STRING
FIG. 44B DECOMPRESSION UNIT
FIG. 44C OUTPUT
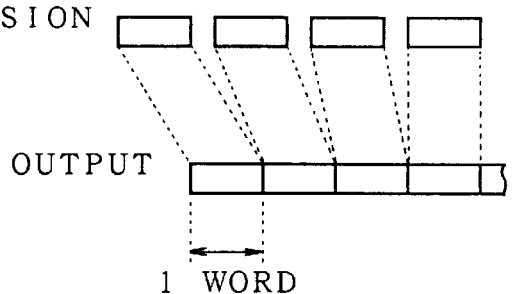
1 WORD

FIG. 45

| | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| JIS KANJI (HEXADECIMAL) ⇨ | 467C | 4B5C | 386C | 253D | 213C | 2537 | 2547 | 253F | 4250 | 244B | 246B | 2439 | 213C | 2547 | 253F | 3035 | 3D4C | 4A7D | 3C30 |
| INDEX HEXADECIMAL (DICTIONARY NO.) ⇨ | 14467C | 14B5C | 13386C | 1253D | 12113C | 12537 | 12547 | 1253F | 14250 | 1244B | 1246B | 12439 | 1213C | 1253F | 13035 | 13D4C | 14A7D | 13C30 |
| | | | | | | 05 (5) | | | | | 07 (7) | | 05 (5) | | | | | |
| DICTIONARY REGISTRATION ⇨ | 1 | 2 | 3 | 4 | 5 | 6 | 7 | 8 | 9 | 10 | 11 | 12 | 13 | 14 | 15 | 16 | 17 | 18 |

⇨ CODE

FIG. 46

| JIS KANJI (HEXADECIMAL) ⇦ | 467C | 386C | 213C | 2547 | 253F | 4250 | 246B | 213C | 3035 | 4A7D | |
| --- | --- | --- | --- | --- | --- | --- | --- | --- | --- | --- | --- |
| | 4B5C | 253D | 2537 | 213C | 244B | 2439 | 2547 | 253F | 3D4C | 3C30 | |

INDEX HEXADECIMAL (DICTIONARY NO.) ⇦ 46 38 21 25 25 42 24 104(260) 30 4A 30
7C 6C 3C 47 3F 50 6B 35 7D 3C
4B 25 25 104(260) 24 24 106(262) 3D 4C
5C 30 37 37 4B 39 25 3F

DICTIONARY REGISTRATION ⇦ 256 258 260 262 263 265 266 267 269 271 272 273 274 275
257 259 261 264 268 270

⇦ CODE

CHARACTER COMPRESSION AND DECOMPRESSION DEVICE CAPABLE OF HANDLING A PLURALITY OF DIFFERENT LANGUAGES IN A SINGLE TEXT

BACKGROUND OF THE INVENTION

The present invention relates to a data compressing apparatus and a data decompressing apparatus for compressing and decompressing source data of a plurality of kinds of character codes which mixedly exist in a character code space and, more particularly, to a data compressing apparatus and a decompressing apparatus for efficiently performing a compression and a decompression in accordance with the kind of character code with respect to a Unicode in which a plurality of language codes mixedly exist, a JIS code or a shift JIS code of a Japanese code space, or the like.

In recent years, various kinds of data such as character code, vector information, image, and the like is treated in a computer and an amount of data to be treated is rapidly increasing. When a large amount of data is treated, a redundancy portion in the data is eliminated and a data amount is compressed, so that a memory capacity can be reduced and the data can be transmitted at a high speed. As a method which can compress various data, a universal encoding has been proposed. In this instance, although the invention is not limited to a compression of character codes but can be also applied to data in various fields, denominations which are used in an information theory are also used hereinbelow. It is assumed that one word unit of data is called a character and an arbitrary word to which data is connected is called a character string.

As a representative method of the universal encoding, there is a Ziv-Lempel code (in more detail, for example, refer to Munakata, "Data compressing method of Ziv-Lempel", The Information Processing, Vol.26, No.1, 1985). In the Ziv-Lempel code, two algorithms such as slide dictionary method and dynamic dictionary method have been proposed. Further, as an improvement of the slide dictionary method, there is an LZSS code (refer to T. C. Bell, "Better OPM/L Text Compression", IEEE Trans. on Commun., Vol. COM-34, No. 12, Dec. 1986). As an improvement of the dynamic dictionary method, there is an LZW (Lempel-Ziv-Welch) code (refer to T. A. Welch, "A Technique for High-Performance Data Compression", Computer, June, 1984). Among those codes, the LZW code is used in a file compression or the like of a memory device because a high-speed process can be performed and the algorithm is simple.

FIG. 1 shows a tree structure of a dictionary in the LZW code. FIG. 2 shows an encoding of character strings in the LZW code. The LZW encoding has a rewritable dictionary, classifies data of input character codes into different character strings, adds numbers in accordance with the appearance order of the character strings, registers the character strings into the dictionary, and also expresses the character string which is being inputted at present by a number of the longest coincidence character string registered in the dictionary, thereby encoding. One character which doesn't coincide is added to the present character string and is registered.

The encoding will now be specifically described in detail with reference to FIGS. 3 and 4. In this instance, in order to simplify the explanation, an encoding of data comprising a combination of three characters of "a", "b", and "c" will be explained as an example. First, input data in FIG. 3 is read in the direction from the left to the right. When the first character "a" is inputted, since there is no coincident character string other than "a" in a dictionary in FIG. 4, an output code (reference numeral ω) is outputted as a code word. A reference numeral 4 is added to a character string "ab" which was expanded by adding the next character "b" and the resultant character string is registered into the dictionary. In the actual registration, the character string is registered in a form of (1b). Subsequently, the second character "b" is positioned at the head of the character string. Since there is no coincident character string other than "b" in the dictionary, the reference numeral 2 is outputted as a code word and the expanded character string "ba" is actually registered into the dictionary in a form of "2a" by adding a reference numeral 5. The third character "a" is positioned at the head of the next character string. In a manner similar to the above, the above processes are continued.

A flowchart of FIG. 5 is an algorithm of the LZW encoding. First in step S1, a character string consisting of one character is previously registered as an initial value with respect to all characters and, after that, the encoding is started. In step S2, the first character K inputted is set to a reference numeral ω to retrieve the dictionary and is used as a prefix string. In step S3, the next character K of the input data is read. In step S4, whether a character string (ωK) obtained by adding the character K read in step S3 to the prefix string ω obtained in step S2 exists in the present dictionary or not is retrieved. If YES in step S4, the character string (ωK) is exchanged to the reference numeral ω in step S5. A check is made in step S5 to see if the input data has been finished. After that, the processing routine is returned to step S3 again and the retrieval of the maximum coincidence length is continued until the character string (ωK) is not found in the dictionary. When the character string (ωK) doesn't exist in the dictionary in step S4, step S7 follows and the reference numeral ω of the character K obtained in step S2 is outputted as a code word (ω). A new reference numeral is added to the character string (ωK) and the resultant character string is registered into the dictionary. Further, the input character K in step S2 is exchanged to the reference numeral ω, a dictionary address N is increased and the judging process in step S5 is executed. After that, the processing routine is returned to step S2 and the next character K is read.

A decoding process of the LZW code will now be specifically described with reference to FIG. 6. As a decoding process, the operation opposite to the encoding is executed. To simplify the explanation, in a manner similar to the encoding process in FIG. 3, the decompression of data comprising a combination of three characters of "abc" will be explained as an example. The first input character is 1. Since the characters "a", "b", and "c" have already been registered as reference numerals 1, 2, and 3 in the dictionary as shown in FIG. 4, the first character is exchanged to the character string "a" of the reference numeral which coincides with the code 1 with reference to the dictionary and is outputted. The next code 2 is also likewise exchanged to the character "b" and is outputted. In this instance, a new reference numeral is added to "1b" obtained by combining the code processed at the preceding time and the first character "b" decoded at this time and the resultant character string is registered into the dictionary. The third code 4 is exchanged from "1b" to "ab" by the retrieval of the dictionary, so that a character string "ab" is outputted. At the same time, a new reference numeral 5 is added to the character string "2a" (=ba) obtained by combining the code 2 processed at the preceding time and the first character "a" of the character string decoded at this time and the resultant character string is registered into the dictionary. The processes are repeated in a manner similar to the above. In the decoding of FIG. 6, there are the following exceptional processes. The exceptional processes occur in the decoding of the sixth input code 8. The code 8 is not defined in the dictionary upon decoding and cannot be decoded. In this case, a character string "5b" obtained by adding the first one character "b" of the character string "ba" decoded at the preceding time to the code 5 processed at the preceding time is obtained and is further exchanged to "2ab" and "bab" and is outputted. After the character string was outputted, a reference numeral 8 is added to the character string "5b" obtained by adding the character "b" of the character string decoded at this time to the code 5 at the preceding time and the resultant character string is registered into the dictionary. The exceptional processes are performed through processes in steps S4 and S9 of a decoding process in FIG. 7, which will be explained hereinbelow. In step S7, finally, the output of the character string and the registration into the dictionary of the character string obtained by adding the reference numeral to a new character string are executed.

A flowchart of FIG. 7 shows a decoding algorithm of the LZW code. First in step S1, in a manner similar to the encoding, the character strings each comprising one character are previously registered as initial values into the dictionary with respect to all characters and, after that, the decoding is started. In step S2, the first code (reference numeral) is read and the present input code "CODE" is set to "OLDcode". Since the first code corresponds to any one of the reference numerals each comprising one character which have already been registered in the dictionary, a character "code (K)" which coincides with the input code "CODE" is found out and the character K is outputted. The outputted character K is set to "char" for the subsequent exceptional processes. Step S3 follows and the next code "CODE" is read and is set as "NEWcode". Step S4 follows and a check is made to see whether the code "CODE" inputted in step S3 has been defined (registered) in the dictionary or not. Since the inputted code word has been generally registered in the dictionary by the processes up to the preceding time, step S5 follows and a character string "code (ωK)" corresponding to the code "CODE" is read out from the dictionary. In step S6, the character string K is temporarily stacked and reference numeral "code (ω)" is set to a new "CODE" and the processing routine is returned to step S5. The procedures in steps S5 and S6 are recursively repeated until the reference numeral ω reaches one character. Finally, step S7 follows and the character stacked in step S6 is popped up in an LIFO (Last-In First-Out) format and is outputted. Simultaneously, in step S7, a new reference numeral is added to a character string expressed by (ω, K) by combining the code ω used at the preceding time and the first character K of the character string decoded at this time and the resultant character string is registered into the dictionary. In this instance, in case of a code (such as a case occurring in the case where a reference numeral just before is referred to in the encoding) which is not registered in step S4, in step S9, "OLDcode" is returned to the code "CODE" and "code(OLDcode, char)" is returned to "NEWcode". After that, the processing routine advances to step S5.

However, in such conventional data compressing and decompressing processes, in spite of a fact that the one-byte construction and the two-byte construction mixedly exist in the actual character code, they are regarded as characters of the same byte construction and processed, so that there is a problem such that an effective compression cannot be expected. FIG. 8A shows a conventional data compressing process in which data is compressed on a byte unit basis by a single-byte compressing unit 400. FIG. 8B shows a conventional decompressing process of compression data, in which the data is likewise decompressed on a byte unit basis by a single-byte decompressing unit 402. In this instance, when considering Japanese as a representative language as an example, in various kinds of codes expressing Japanese, namely, character codes such as JIS code, shift JIS code, and the like, a character and a character string are expressed in a form of a plurality of bytes or a form in which a single byte and a plurality of bytes mixedly exist. On the other hand, in the compressing process, as shown in FIG. 8A, since the data is all processed as characters and character strings of a single byte by the single-byte compressing unit 400, the character expressed by the single byte and the lower byte of the character expressed by a plurality of bytes are regarded as the same character. Therefore, there is a problem such that by the byte-unit compression of the characters consisting of a plurality of bytes, a meaningless data string is eventually registered into the dictionary and is encoded and an effective compression cannot be expected.

FIG. 9 shows the LZW encoding in the JIS Kanji code. Since data is fetched into the dictionary irrespective of the upper byte and lower byte, it will be understood that a meaningless character string is also registered and a compressing effect cannot be expected. Namely, a meaningless character string such as a combination of lower byte and upper byte of two adjacent characters or the like is registered. FIG. 10 shows the LZW encoding in the shift JIS Kanji code. In a manner similar to the above, since data is fetched into the dictionary irrespective of the upper byte and lower byte, it will be understood that a meaningless character string is also registered and a compressing effect cannot be expected.

There is a similar problem even in character codes other than Japanese. For example, even in a Unicode proposed as a character code in which various languages are integratedly treated by the international standardization, since one character is constructed by two bytes (or 4 bytes), in the conventional compressing process in which data is compressed on a byte unit basis, a similar problem occurs. Particularly, even if the same character kind is used, when the language differs, a connecting method of characters differs. However, hitherto, since a character string has been registered without considering a difference due to the languages, a compressing effect cannot be expected.

SUMMARY OF THE INVENTION
(Unicode)

According to the invention, there is provided a data compressing apparatus and a data decompressing apparatus in which, for example, for a Unicode in which different languages mixedly exist or the like, by distinguishing and compressing various characters in which each language or a statistical nature in each language differs, a compressing performance is raised.

In case of the Unicode as a target, a data compressing apparatus inputs and compresses a data string of a Unicode in which character codes of a plurality of kinds of languages mixedly exist. The data compressing apparatus is constructed by: a language discriminating unit for discriminating a kind of language code which is inputted; a language string separating unit for separating a data string into a language string of each language that was discriminated by the language discriminating unit; and a language string compressing unit for individually compressing each language string separated by the language string separating unit. A character code system of the Unicode has a 2-dimensional code space (code plane) of a cell octet (column number) and a row octet (row number). One character is expressed by a character code of at least two bytes of the cell (column) octet of one lower byte and the row octet of one upper byte. Further, a different character code space is allocated for each of a plurality of kinds of languages by the row octet. Therefore, the language discriminating unit discriminates the kind of language from the row octet of each character code. The language string separating unit separates the character code of one byte or two bytes which is determined by the discriminated language kind and constructs a language string of each language.

A data decompressing apparatus of the invention in which the compression data of the Unicode is processed as a target is constructed by: a language string decompressing unit for decompressing the language string on a language unit basis from the compression data; and a language string reconstructing unit for decompressing the data string in which a plurality of kinds of language codes mixedly exist from each language string decompressed by the language string decompressing unit.

(Single-language code)

According to the invention, there are provided a data compressing apparatus and a data decompressing apparatus, in which for the single-language code, for example, Japanese character code, by distinguishing and compressing the character kinds in which the byte construction of each character code or the statistic nature in the character code differs, thereby raising a compressing performance.

(Compression and decompression of byte construction unit)

As a first embodiment in case of the Japanese character code, a data compressing apparatus and data decompressing apparatus of the invention compress and decompress data every different byte construction in various kinds of character codes. The invention is not limited to the Japanese code but can be also expanded to the other language codes. The data compressing apparatus for compressing Japanese source data every byte construction is constructed by: a code kind discriminating unit; a byte construction separating unit; and a character string compressing unit. The code kind discriminating unit discriminates the kind of character code to which the input data string from a Japanese source belongs and outputs code kind ID information. The byte construction separating unit detects the byte construction of each character code of the input data string on the basis of the code kind ID information and separates into a plurality of kinds of character strings of different byte constructions. The character string compressing unit individually compresses the plurality of kinds of character strings of different byte constructions separated by the byte construction separating unit. More specifically speaking, the data string is a data string of any one of a plurality of kinds of character codes allocated to a 2-dimensional character code space which is defined by an upper byte and a lower byte. For example, a JIS code, a shift JIS code, an EUC code, a Unicode, and a JEF code are allocated as a plurality of kinds of character codes into the character code space. Those character codes are processed. The code kind discriminating unit is constructed by a temporary memory unit, first to third frequency detecting units, and a code identifying unit. That is, the data in a predetermined interval of the data string is stored into the temporary memory unit. With respect to the stored data, a frequency distribution of a 1-byte character in the character code space is detected by the first frequency detecting unit. A frequency distribution of a plural-byte character in the character code space is detected by the second frequency detecting unit. Further, a frequency distribution of an ID character code which is used in each of a plurality of kinds of character codes is detected by the third frequency detecting unit. The character code kind of the data string, for example, the JIS code, shift JIS code, EUC code, Unicode, or JEF code is identified by the code identifying unit on the basis of a deviation among the frequency distributions in the character code space by the three frequency detecting units. The byte construction separating unit is constructed by a byte construction detecting unit and a character string separating unit. The byte construction detecting unit separates the data string on a byte unit basis, detects whether the character has a 1-byte construction or a plural-byte construction, and outputs the byte construction detection information. The character string separating unit separates the data string into the character string of the 1-byte construction and the character string of the plural-byte construction on the basis of the byte construction detection information. The character string compressing unit is constructed by: a single-byte compressing unit; a plural-byte compressing unit; a character code ID information output unit; a byte construction change output unit; and a code selecting unit. The single-byte compressing unit compresses the character string of the 1-byte construction. The plural-byte compressing unit compresses the character string of the plural-byte construction. The character code ID information output unit outputs code ID information indicative of the kind of character code in accordance with the code kind ID information. The byte construction change output unit outputs byte construction change information indicative of a change in byte construction on the basis of the byte construction detection information. The code selecting unit finally selectively synthesizes the character code ID information, byte construction change information, single-byte compression data, and plural-byte compression data and outputs the synthesized data.

A data decompressing apparatus for decompressing data obtained by compressing Japanese source data every byte construction is constructed by a character string decompressing unit and a character string reconstructing unit. The character string decompressing unit separates the compression data every byte construction and individually decompresses the character strings. The character string reconstructing unit couples the character strings of different byte constructions which were decompressed by the character string decompressing unit 17 into one string, thereby reconstructing the original character string. More specifically speaking, the character string decompressing unit has a code separating unit, a single-byte decompressing unit, and a plural-byte decompressing unit. The code separating unit separates the single-byte compression data, plural-byte compression data, code ID information, and byte construction change information from the compression data. The single-byte decompressing unit decompresses the character string of the single-byte construction from the separated single-byte compression data. The plural-byte decompressing unit decompresses the character string of the plural-byte construction from the separated plural-byte compression data. The character string reconstructing unit couples the decompressed character string of the single-byte construction and the decompressed character string of the plural-byte construction and decompresses the original character code string on the basis of the code ID information and byte construction change information which were separated by the code separating unit of the character string decompressing unit.

(Compression and decompression of each character kind)

According to the second embodiment of the data compressing apparatus and data decompressing apparatus of the invention in which Japanese source data is processed as a target, data is separated every different character kind in various kinds of character codes and the compression and decompression are executed. The invention is not limited to the Japanese code but can be also obviously expanded to the other language codes. In this case, the data compressing apparatus is constructed by a code kind discriminating unit, a character kind separating unit, and a character string compressing unit. The code kind discriminating unit discriminates the kind of character code such as JIS code, shift JIS code, or the like to which the input data string belongs and outputs code kind ID information. The character kind separating unit detects the character kind of each character code of the data string on the basis of the code kind ID information and separates into the character string of every different character kind. The character string compressing unit individually compresses each character string of every different character kind separated by the character kind separating unit. More specifically speaking, the code kind discriminating unit is constructed by a temporary memory unit, first to third frequency detecting means, and a code identifying unit and identifies the character code kind of the data string, for example, the JIS code, shift JIS code, EUC code, Unicode, or JEF code on the basis of the deviation among the frequency distributions in the character code space by the three frequency detecting units. The character kind separating unit has a character kind detecting unit and a character string separating unit. The character kind detecting unit separates the data string on a byte unit basis, detects a character kind such as halfwidth, fullwidth, alphanumeric, Katakana, Hiragana, Kanji, or the like, and outputs character kind detection information. On the basis of the character kind detection information, the character string separating unit separates the character string every character kind such as halfwidth alphanumeric character, halfwidth Katakana, halfwidth others, fullwidth alphanumeric characters, fullwidth Katakana, fullwidth Hiragana, fullwidth Kanji, and fullwidth others. As character kind compressing units, the character string compressing unit has, for example, a halfwidth alphanumeric compressing unit, a halfwidth Katakana compressing unit, a halfwidth others compressing unit, a fullwidth alphanumeric compressing unit, a fullwidth Katakana compressing unit, a fullwidth Hiragana compressing unit, a fullwidth Kanji compressing unit, and a fullwidth others compressing unit. The character string compressing unit also has a character code ID information output unit and a code selecting unit. The character kind change information output unit outputs character code ID information indicative of the identified character kind of the character code in accordance with the character kind ID information. The character kind change information output unit outputs character kind change information indicative of a change in character kind. Further, the code selecting unit selectively synthesizes the character code ID information, character kind change information, and compression data for every character kind and outputs the synthesized data.

A data decompressing apparatus for separating data every different character kind in various kinds of character codes and decompressing is constructed by a character string decompressing unit and a character string reconstructing unit. The character string decompressing unit separates the compression data every character kind and individually decompresses the character string of every character kind. More specifically speaking, the character string decompressing unit has a code separating unit and a character kind decompressing unit. The code separating unit separates the compression data, code ID information, and character kind change information of each character kind. The character kind decompressing unit decompresses the character string every character kind from the compression data of each character kind separated by the code separating unit. The character string reconstructing unit couples the character string decompressed every character kind and reproduces the original character string on the basis of the code ID information and character kind change information which were separated by the code separating unit of the character string decompressing unit.

(Compression and decompression by byte unification)

A data compressing apparatus and a data decompressing apparatus as a third embodiment in which Japanese source data is processed as a target unify the character strings of different byte constructions into one byte construction by the one and only form and perform the compression and decompression. The invention is not limited to the Japanese code but can be also expanded to the other language codes. In this case, the data compressing apparatus is constructed by a code kind discriminating unit, a byte construction unifying unit, and a character string compressing unit. The code kind discriminating unit discriminates the kind of character code, for example, JIS code, shift JIS code, or the like to which the input data string belongs and outputs the code kind ID information. The byte construction unifying unit detects the byte construction of each character of the data string on the basis of the code kind ID information and unifies the characters of different byte constructions into a character of one byte construction. The character string compressing unit compresses the character string of the same byte construction unified by the byte construction unifying unit. More specifically speaking, the code kind discriminating unit is constructed by a temporary memory unit, first to third frequency detecting units, and a code identifying unit and identifies the character code kind of the data string, for example, JIS code, shift JIS code, EUC code, Unicode, or JEF code on the basis of the deviation of the frequency distributions in the character code space by the three frequency detecting units. The byte construction unifying unit has a byte construction detecting unit and a byte construction converting unit. The byte construction detecting unit separates a data string on a byte unit basis and detects whether the character is a 1-byte character or a plural-byte character. The byte construction converting unit adds a dummy byte to the character of the 1-byte construction detected by the byte construction detecting unit and unifies to a character of the plural-byte construction. The character string compressing unit comprises a character code ID information output unit, a plural-byte compressing unit, and a code selecting unit. In accordance with the code kind ID information, the character code ID information output unit outputs the character code ID information which is a Japanese character code and indicates its kind. The plural-byte compressing unit compresses the character string of the plural-byte construction. The code selecting unit selectively synthesizes the character code ID information and plural-byte compression data and outputs the synthesized data.

A data decompressing apparatus in this case is constructed by a character string decompressing unit and a character string reconstructing unit. The character string decompressing unit decompresses the character code string of the unified byte construction of the compression data. The character string reconstructing unit reconstructs the character string from the unified byte construction decompressed by the character string decompressing unit to a character string of a different byte construction. More specifically speaking, the character string decompressing unit has a code separating unit and a plural-byte decompressing unit. The code separating unit separates the plural-byte compression data and code ID information. The plural-byte decompressing unit decompresses the character string of the unified byte construction from the unified byte compression data separated by the code separating unit. The character string reconstructing unit decompresses the character code string in which the character code of the single-byte construction and the character code of the plural-byte construction mixedly exist on the basis of the code ID information separated by the code separating unit.

As mentioned above, for the Unicode or the like in which different languages mixedly exist and which has been international standardized, by distinguishing and compressing various characters in which the languages or statistic natures in the languages are different, a compressing performance can be raised. An effective compression can be expected even for various language codes such as various Japanese character codes or the like for the different byte constructions or different character kinds.

The above and other objects, features, and advantages of the present invention will become more apparent from the following detailed description with reference to the drawings.

BRIEF DESCRIPTION OF THE DRAWINGS

FIG. 3 is a schematic explanatory diagram of an LZW encoding for character strings of characters abc as an example;

FIG. 4 is an explanatory diagram of a dictionary which is referred in the LZW encoding in FIG. 3;

FIG. 6 is a specific explanatory diagram of an LZW decoding for character strings of characters abc as an example;

FIG. 9 is an explanatory diagram in case of LZW encoding on a byte unit basis with respect to a JIS Kanji code;

FIG. 11 is a block diagram of a data compressing apparatus of the invention in which the Unicode is processed as a target;

FIG. 12 is a block diagram of a data decompressing apparatus of the invention in which the Unicode is processed as a target;

FIGS. 16A to 16E are explanatory diagrams for the allocation of a whole construction in the Unicode, General script, Symbol, and Concerning Orient;

FIG. 27 is an explanatory diagram of byte constructions of various Japanese codes;

FIG. 31 is a block diagram of a data compressing apparatus of the invention in which a Japanese code is compressed as a target every character string of a different character kind;

FIG. 32 is a block diagram of a data decompressing apparatus of the invention in which data obtained by compressing a Japanese code as a target every character string of a different character kind is decompressed;

FIGS. 38A to 38C are explanatory diagrams for a plural-byte compressing unit in FIG. 37 for compressing a character string of one word consisting of two bytes on a word unit basis;

FIGS. 39A to 39C are explanatory diagrams of the plural-byte compressing unit in FIG. 37 for compressing a character string of one word consisting of one byte on a 2-word unit basis;

FIGS. 40A to 40C are explanatory diagrams of the plural-byte compressing unit in FIG. 37 for compressing a character string of one word consisting of one byte on a word unit basis;

FIG. 41 is a detailed block diagram of the data compressing apparatus in FIG. 36;

FIGS. 42A to 42C are explanatory diagrams of a plural-byte decompressing unit in FIG. 41 for decompressing data obtained by compressing a character string of one word consisting of two bytes on a word unit basis;

FIGS. 43A to 43C are explanatory diagrams of the plural-byte decompressing unit in FIG. 41 for decompressing the data obtained by compressing a character string of one word consisting of one byte on a 2-word unit basis;

FIGS. 44A to 44C are explanatory diagrams of the plural-byte decompressing unit in FIG. 41 for decompressing the data obtained by compressing a character string of one word consisting of one byte on a word unit basis;

FIG. 45 is an explanatory diagram in the case where a JIS Kanji code is Ziv-Lempel encoded on a word unit basis by using two bytes as one word; and FIG. 46 is an explanatory diagram in the case where a JIS Kanji code is Ziv-Lempel encoded on a word unit basis by using one byte as one word.

DETAILED DESCRIPTION OF THE PREFERRED EMBODIMENT

[Compression and decompression of Unicode]

Figure 1:
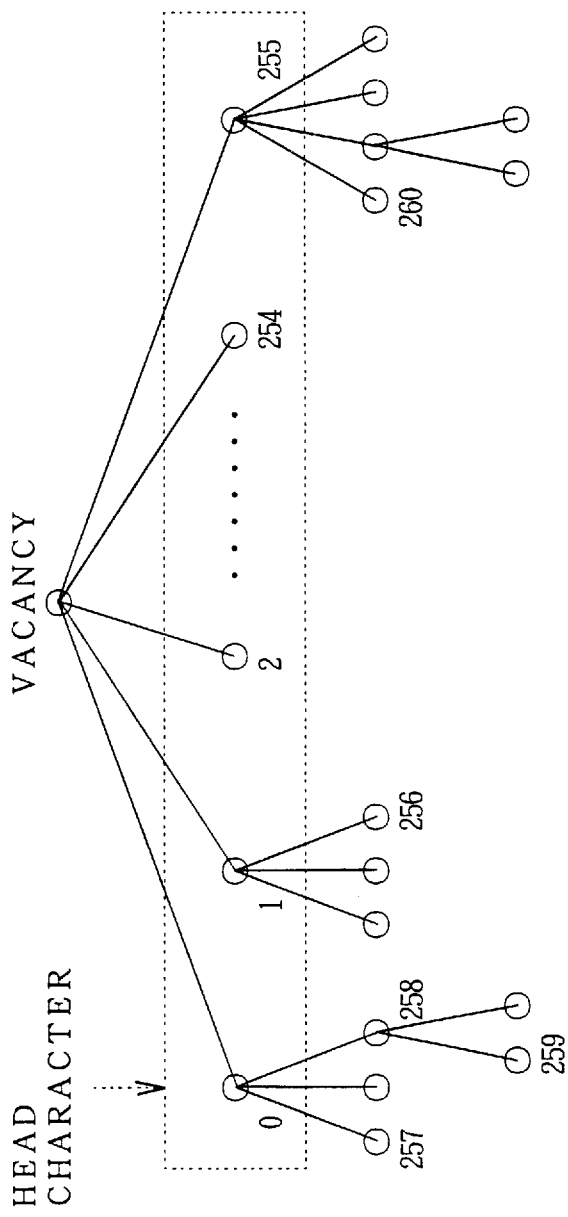
FIG. 1 is an explanatory diagram of a tree structure of a dictionary in a conventional LZW code.
Figure 2:
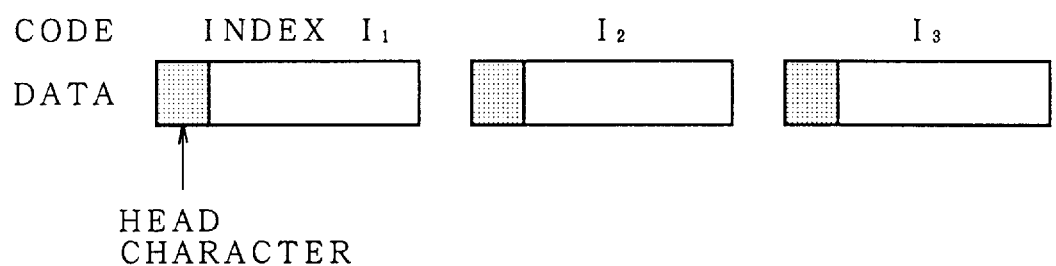
FIG. 2 is a schematic explanatory diagram of an encoding of character strings by an LZW.
Figure 5:
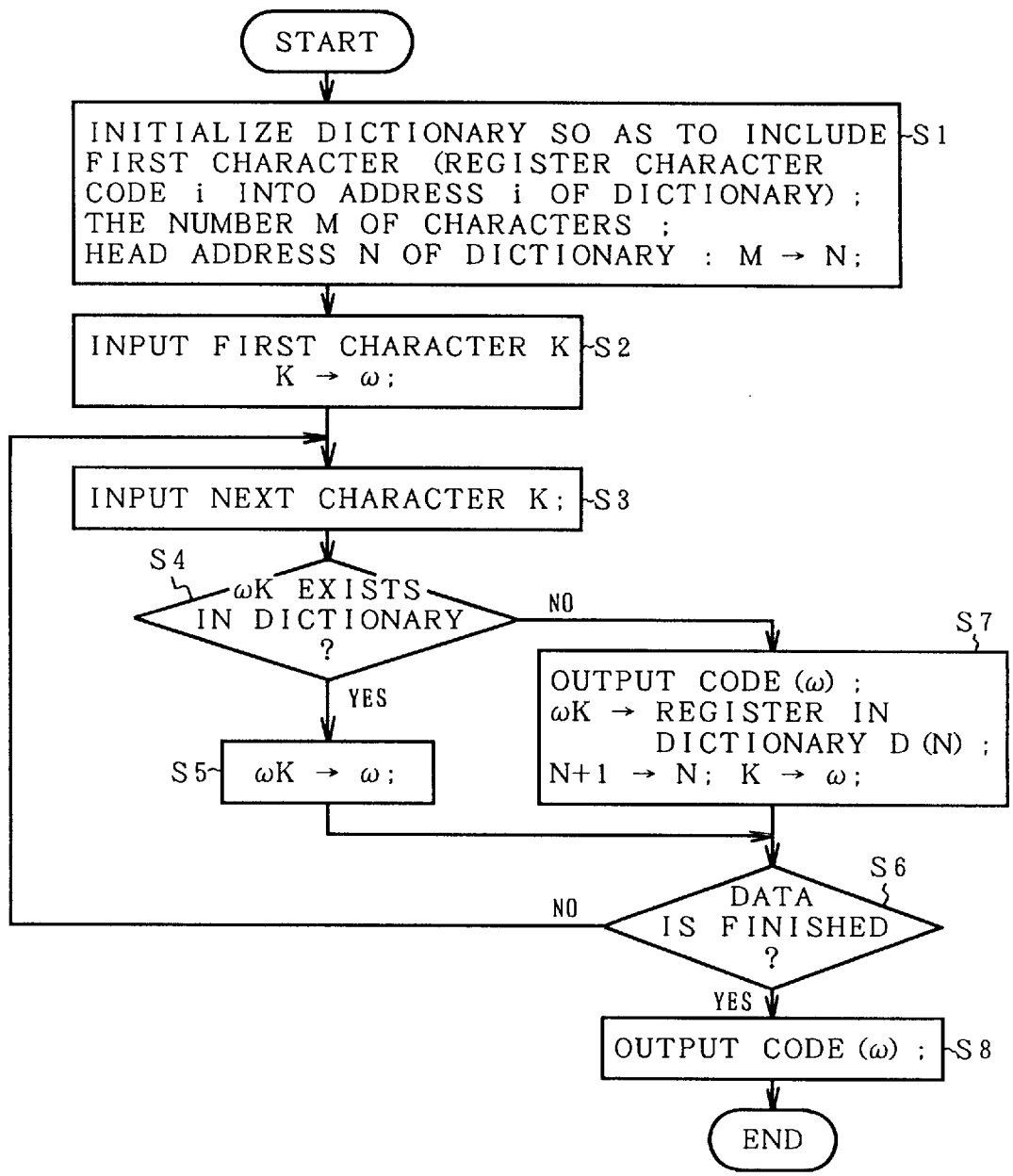
FIG. 5 is a flowchart for an LZW encoding algorithm.
Figure 7:
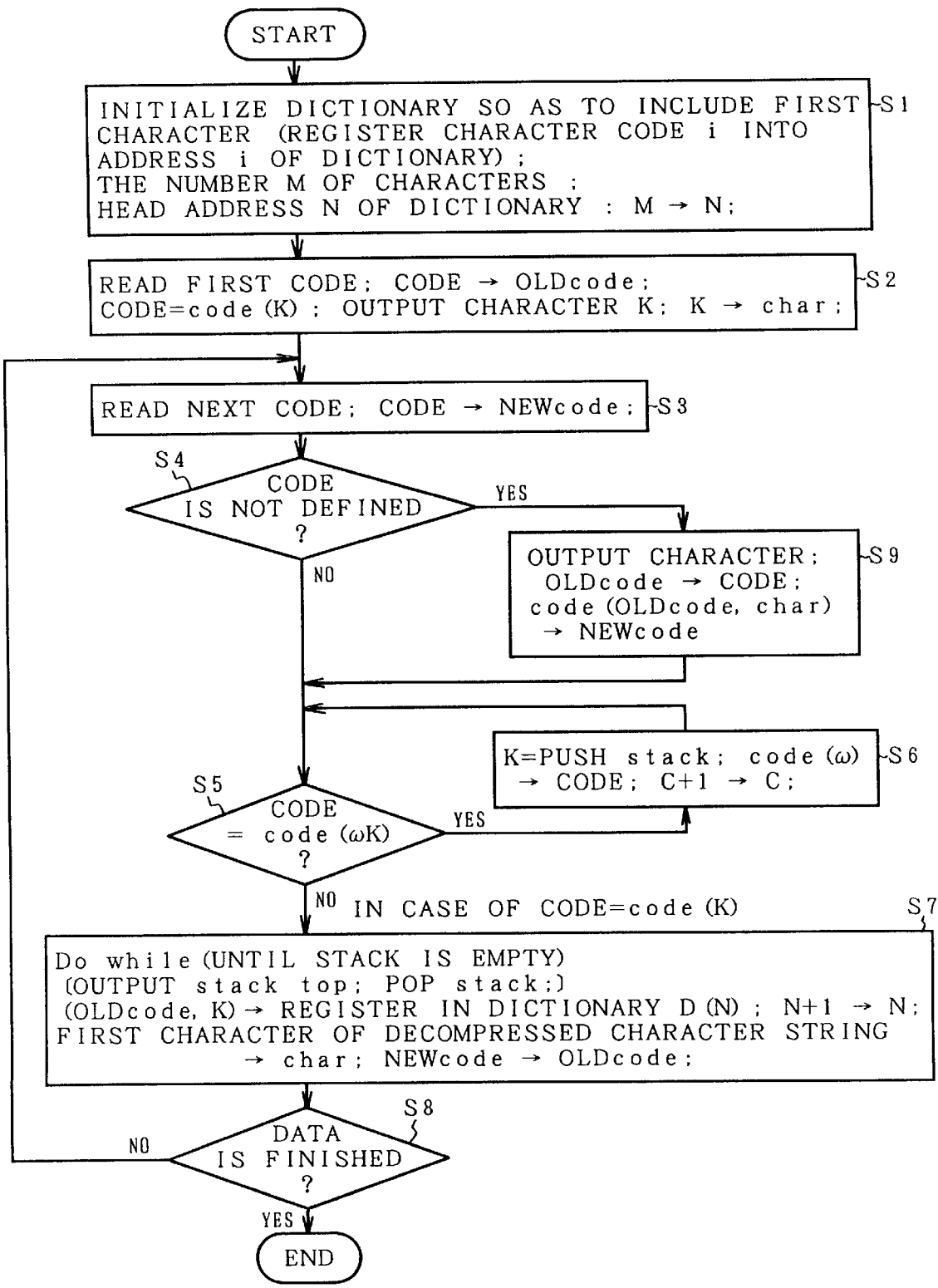
FIG. 7 is a flowchart for an LZW decoding algorithm.
Figure 8A:
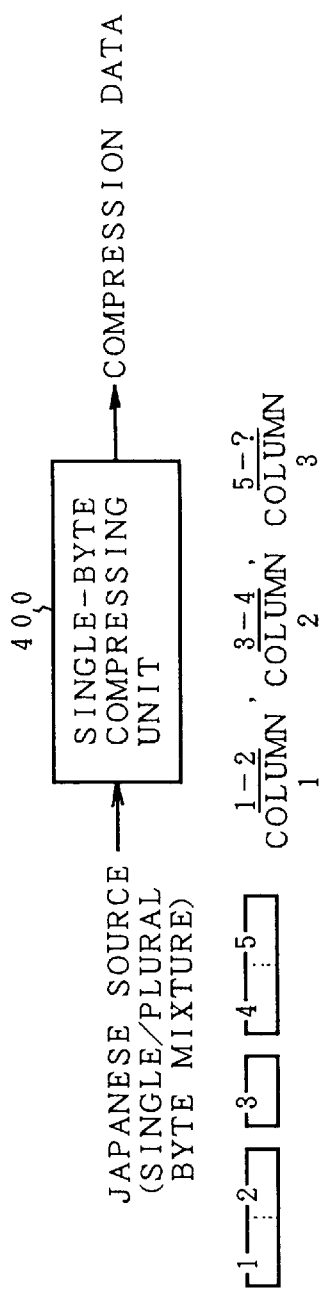
FIGS. 8A and 8B are block diagrams of a conventional apparatus for performing a compression and a decompression of a single byte.
Figure 8B:
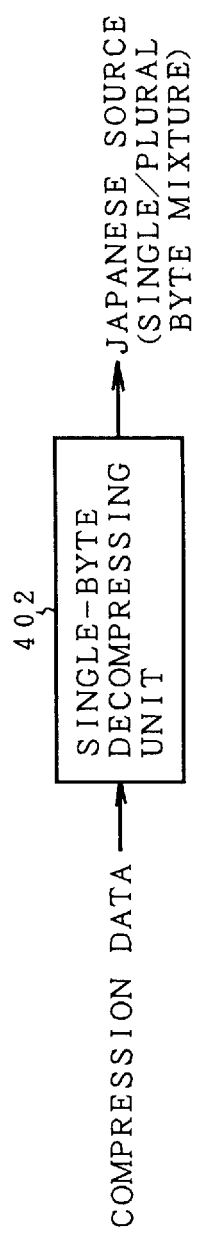
Figure 10:
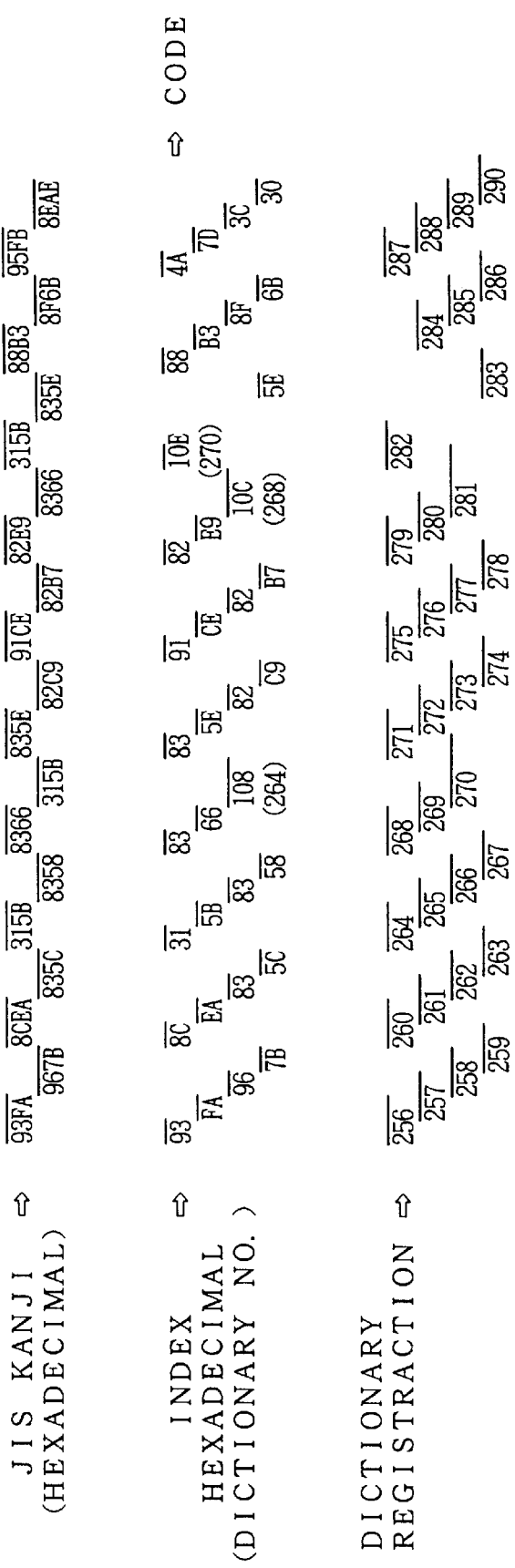
FIG. 10 is an explanatory diagram in case of LZW encoding on a byte unit basis with respect to a shift JIS Kanji code.

FIG. 11 is a block diagram of a data compressing apparatus of the invention for source data, as a target, of the Unicode that is known as an international standard of a character code 10646 according to the International Standardization Organization (ISO) and the International Electrotechnical Commission (IEC). The data compressing apparatus of the invention is constructed by a language discriminating unit 10, a language string separating unit 12, and a language string compressing unit 14. The language discriminating unit 10 inputs source data of the Unicode and discriminates the kinds of a plurality of kinds of language codes which are used in the Unicode. The language string separating unit 12 separates the data into a language string of each language on the basis of the language discriminated by the language discriminating unit 10. The language string compressing unit 14 individually compresses the language strings separated by the language string separating unit 12 and, after that, unifies them and outputs the unified data as compression data.

FIG. 12 is a diagram showing a data decompressing apparatus for decompressing the source data of the Unicode from the compression data derived by the data compressing apparatus of FIG. 11. The data decompressing apparatus is constructed by a language string decompressing unit 20 and a language string reconstructing unit 22. The language string decompressing unit 20 inputs the compression data and decompresses the language string on a language unit basis. The language string reconstructing unit 22 decompresses the data string of the Unicode in which a plurality of kinds of language codes mixedly exist from the decompressed language strings.

Figure 13:
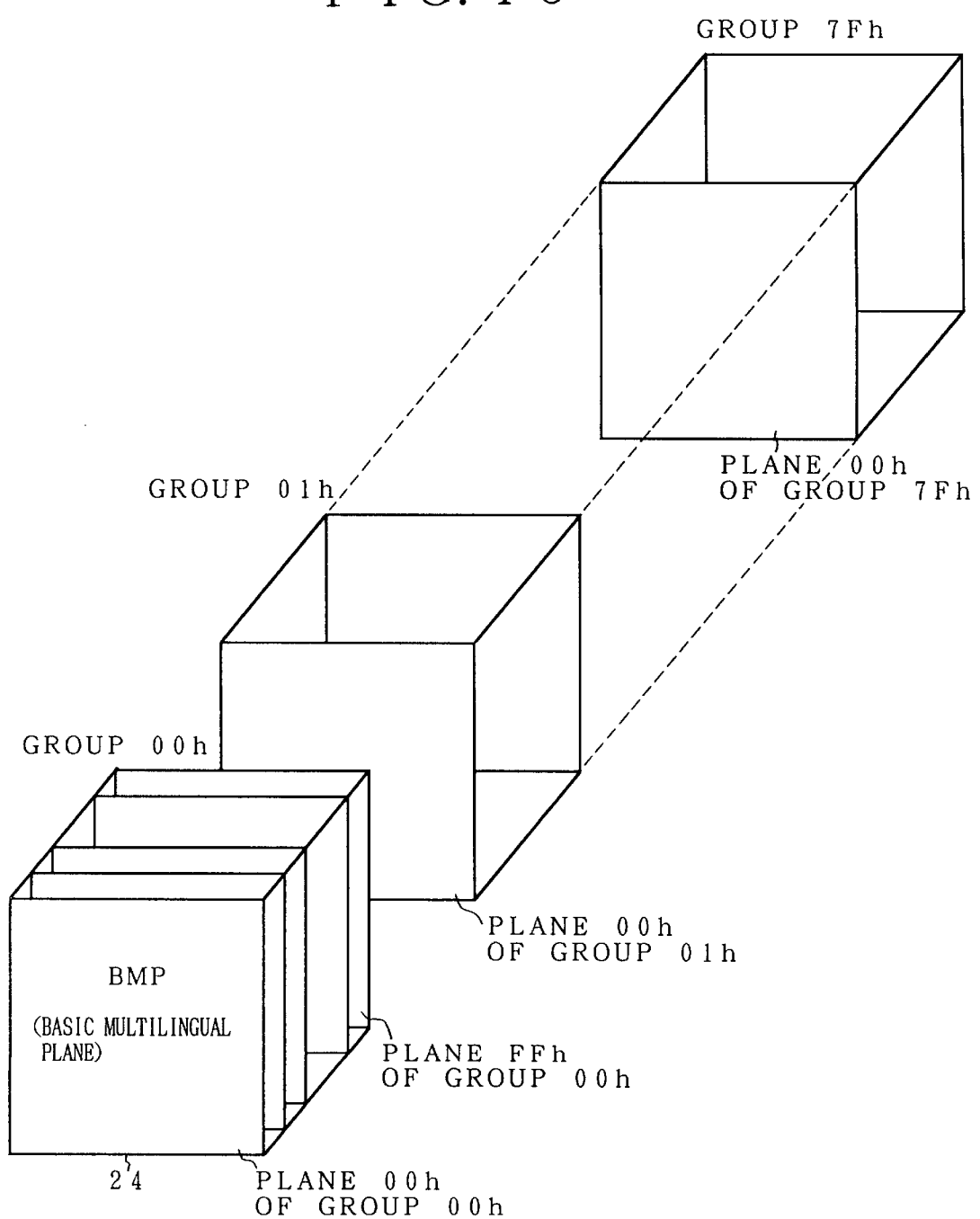
FIG. 13 is an explanatory diagram of a Unicode space.
Figure 14:
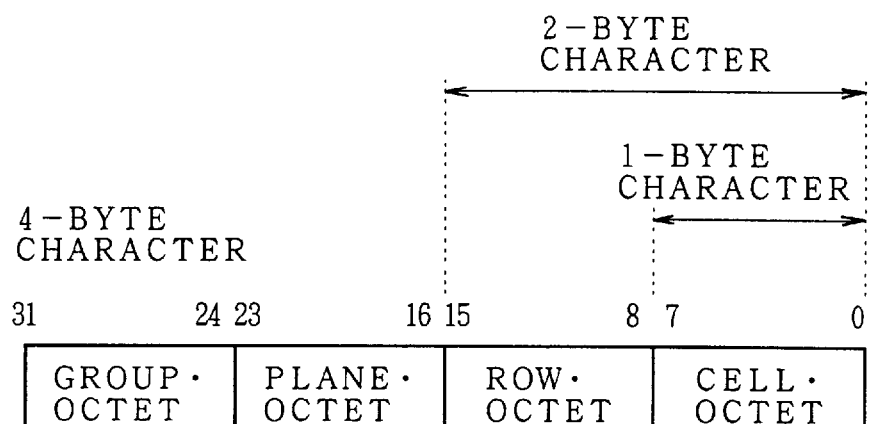
FIG. 14 is an explanatory diagram of a byte construction of the Unicode.
Figure 15:
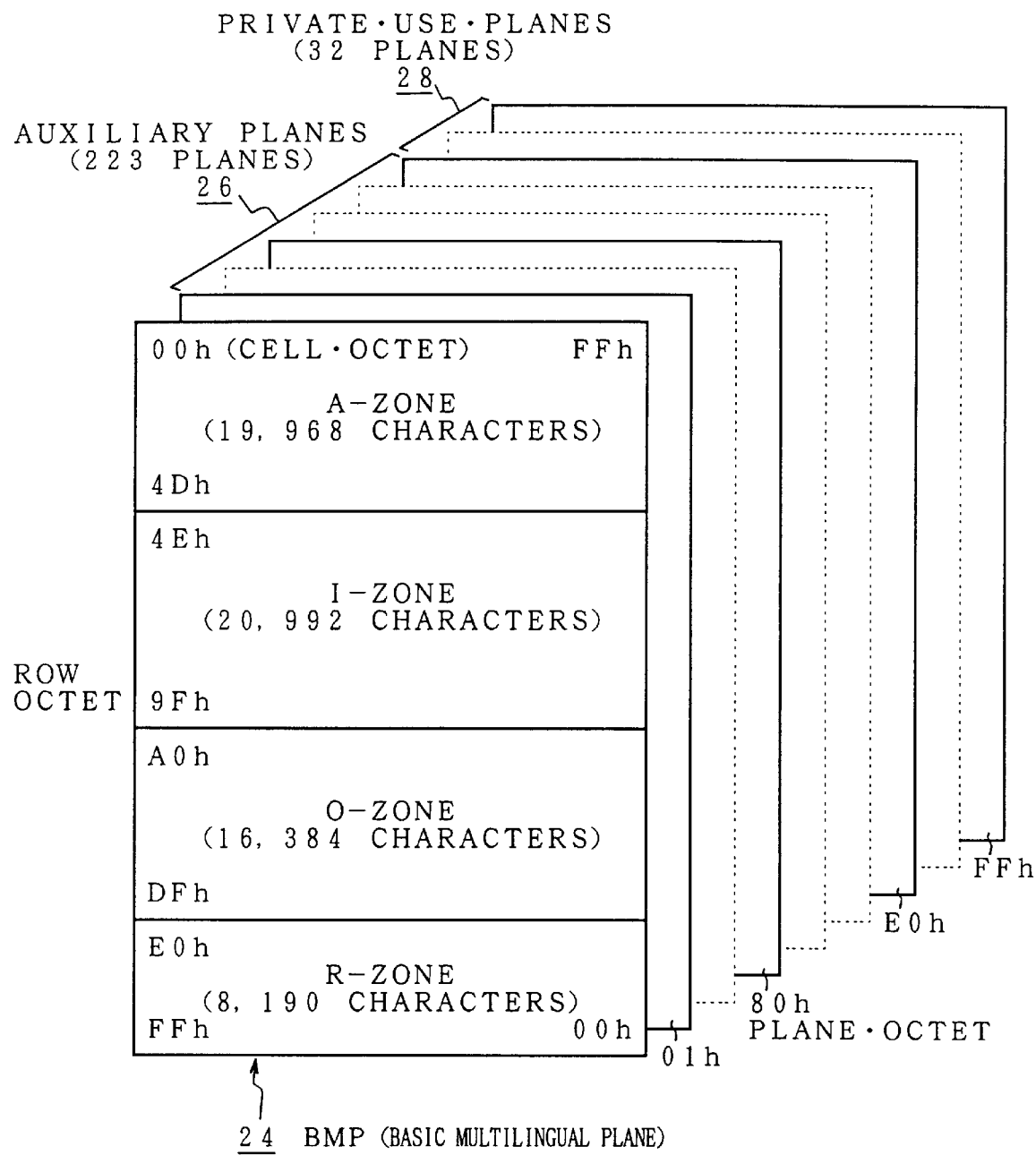
FIG. 15 is an explanatory diagram of a basic multilingual plane of a Unicode space.

The unicode as a target in the data compressing apparatus of FIG. 11 and the data decompressing apparatus in FIG. 12 will now be described. FIG. 13 is a code space of the Unicode and it is constructed by 128 groups of 00h to 7Fh as a hexadecimal notation. Among them, a plane 00h of the group 00h is called a BMP (Basic Multilingual Plane). As shown in FIG. 14, the Unicode is constructed by two bytes or four bytes. In case of the 2-byte construction, the character of each language is expressed by a 2-dimensional expression of a row octet (=row byte) of an upper byte and a cell octet (=cell byte) of a lower byte. FIG. 15 shows the details of the basic multilingual plane 24 in FIG. 13. Subsequent to the BMP 24, an auxiliary plane 26 and a private use plane 28 are provided. The BMP 24 is divided into an A zone, an I zone, an O zone, and an R zone. The languages can be distinguished by the row octet. 00h to 4Dh of the row octet belong to the A zone. ASCII, Hiragana, Katakana, Hangul characters, Arabic characters, characters for mathematics, and the like are included in the A zone. 4Eh to 9Fh of the row octet belong to the I zone. Oriental Kanji is mixedly included in the I zone.

Figure 16D:
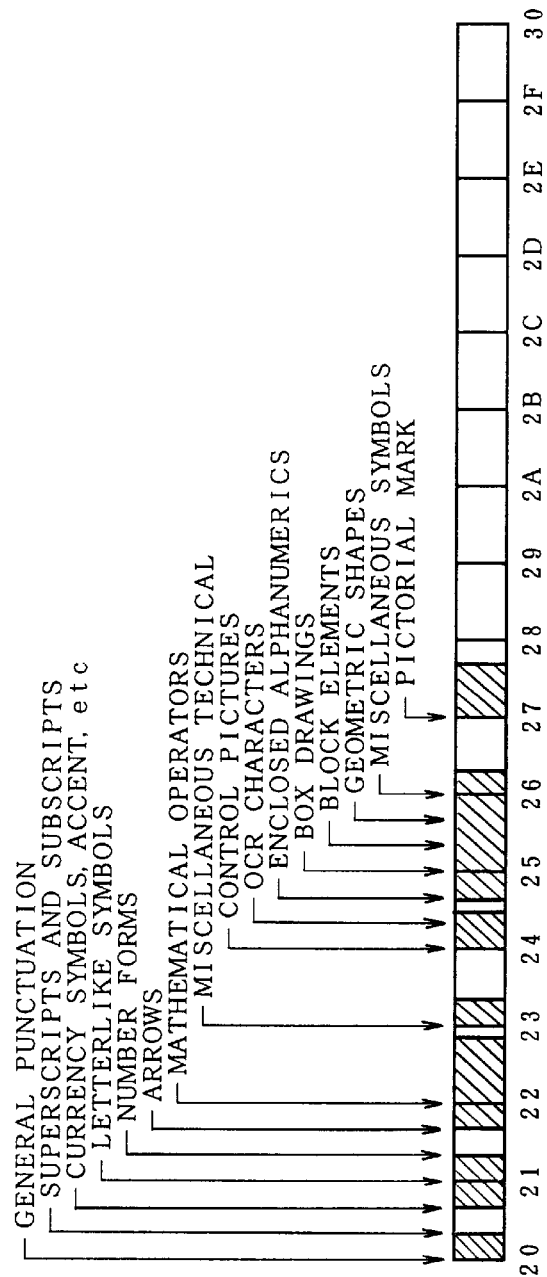
Figure 16E:
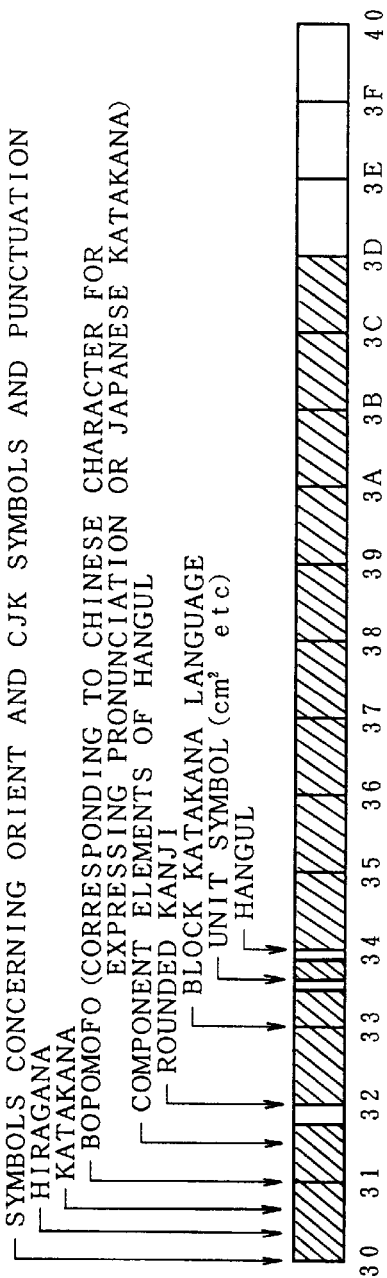

FIGS. 16A to 16E show the details of the whole construction in the Unicode, general script, symbol, and concerning Orient. FIG. 16A shows the whole construction of the BMP 24 in FIG. 15. The general script, symbol, and concerning Orient are allocated as shown in the hatched portions from the head side of the space. Kanji is allocated to a location near 40h in the row octet. FIG. 16B shows a portion of the general script in FIG. 16A. Latin is allocated at the head and each language is subsequently allocated. FIG. 16D shows a portion of the symbol in FIG. 16A. Various symbols and control functions such as general punctuation, superscripts and subscripts, currency symbols, accent, etc. are allocated. FIG. 16E shows a portion of concerning Orient. Hiragana, Katakana, Hangul characters, Kanji, etc. are allocated.

Figure 17:
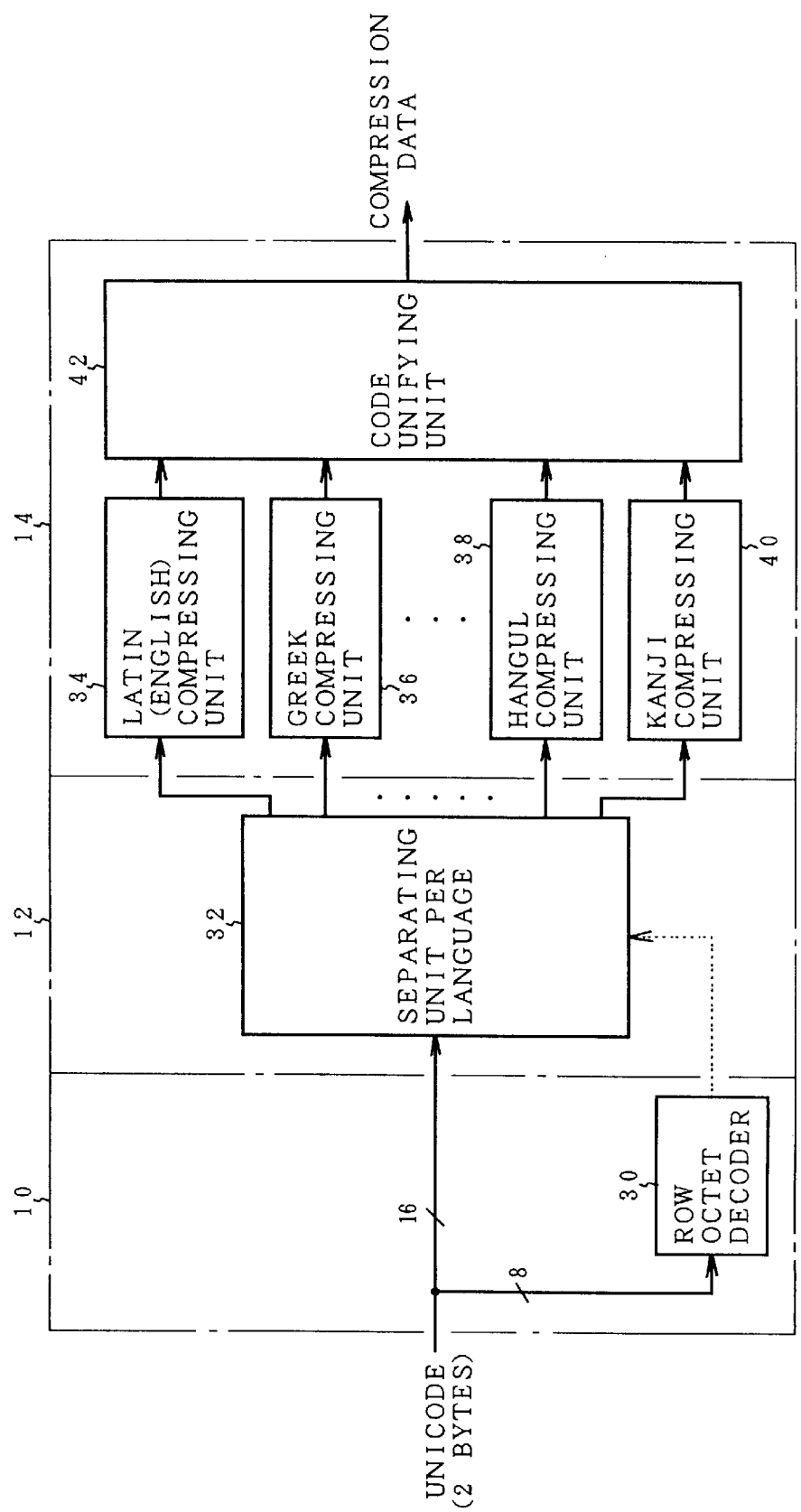
FIG. 17 is a block diagram of a data compressing apparatus for a Unicode multilingual source as a target.

FIG. 17 is a block diagram of a specific embodiment of the data compressing apparatus in FIG. 11. A row octet decoder 30 is provided for the language discriminating unit 10. For example, since a character of two bytes in FIG. 14 is inputted as Unicode source data, the row octet decoder 30 fetches the upper byte (upper eight bits) and decodes the row octet, thereby discriminating the kind of language. A separating unit 32 per language is provided for the language string separating unit 12. On the basis of the discrimination result of the language by the row octet decoder 30, the separating unit 32 per language separates the input Unicode data into each language string such as Latin (English), Greek, or the like. A compressing unit corresponding to each language allocated for the Unicode is individually provided for the language string compressing unit 14. In the embodiment, a Latin compressing unit 34, a Greek compressing unit 36, a Hangul compressing unit 38, a Kanji compressing unit 40, and the like are provided. As a compressing unit per language which is provided for the language string compressing unit 14, it is sufficient to properly decide the compressing unit in accordance with the language which is treated in the Unicode source data as a compression target. The compression data per language compressed by each of the Latin compressing unit 34, Greek compressing unit 36, Hangul compressing unit 38, and Kanji compressing unit 40 is unified by a code unifying unit 42 and the unified data is outputted as compression data. As a compressing method of each compressing unit per language provided for the language string compressing unit 14, a plurality of dictionary memories corresponding to the languages are provided and there is executed a Ziv-Lempel encoding for encoding by a longest coincidence retrieval of the character string which is inputted per data of the language string and the character string which has already been registered in the dictionary for every language. In the Ziv-Lempel encoding, any one of the dynamic dictionary method and the slide dictionary method can be used. As another compressing method, for the character string separated every language, on the basis of a probability table per language string obtained until now, the character string which is inputted every data can be also multi-value arithmetic encoded. The source data of the Unicode in which different languages mixedly exist is separated every language and is individually compressed, so that the compression of each character string in which statistic natures are similar is executed. A compressing function in the Ziv-Lempel encoding, arithmetic encoding, or the like is effectively used and a high compression ratio can be realized.

Figure 18:
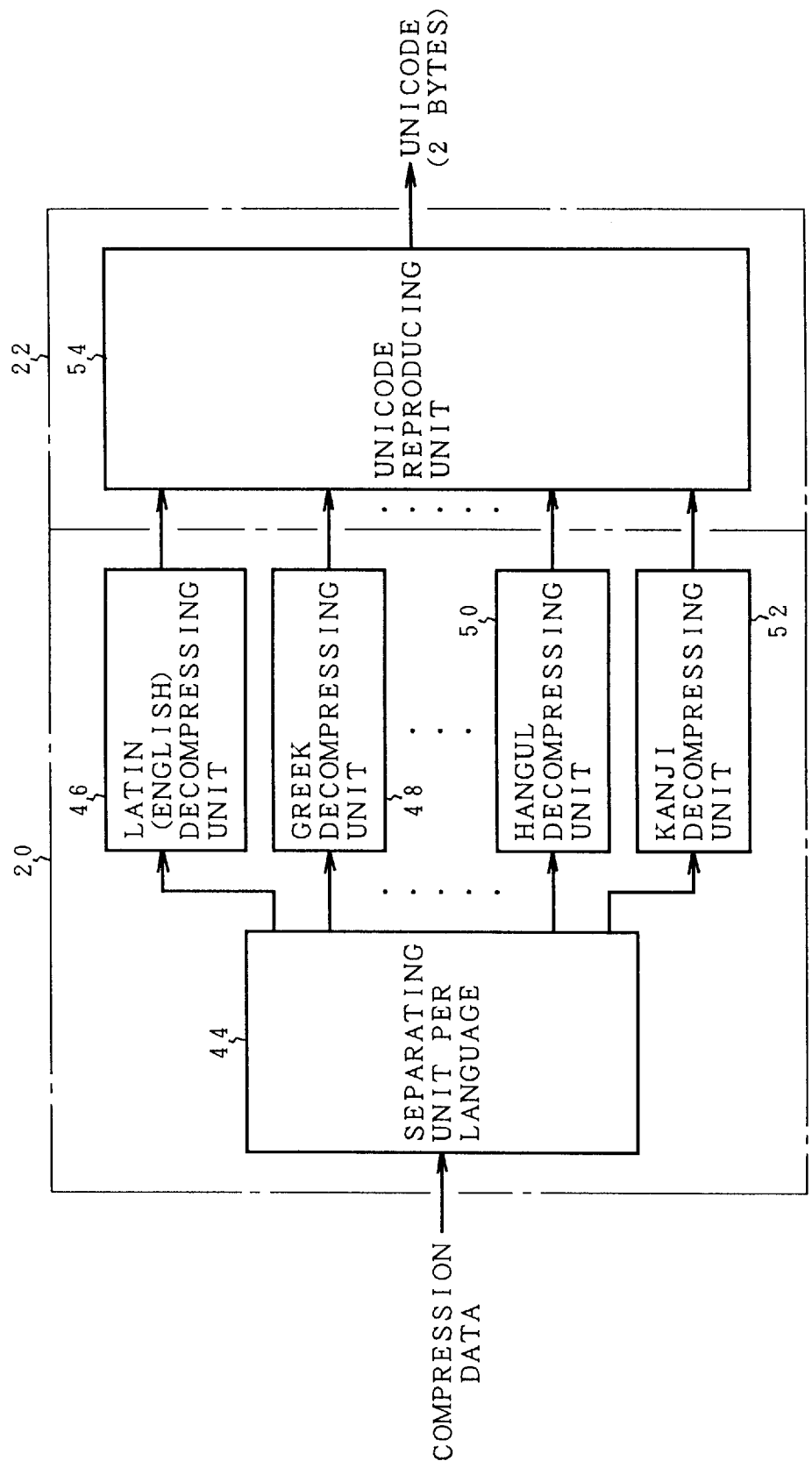
FIG. 18 is a block diagram of a data decompressing apparatus for a Unicode multilingual source as a target.

FIG. 18 shows an embodiment of a data decompressing apparatus for decompressing the original Unicode source data from the compression data obtained by the data compressing apparatus in FIG. 17. A separating unit 44 per language is provided for the language string decompressing unit 20 of the data decompressing apparatus and separates the inputted compression data into the compression data per language. Subsequent to the separating unit 44 per language, a Latin decompressing unit 46, a Greek decompressing unit 48, a Hangul decompressing unit 50, and a Kanji decompressing unit 52 are provided in correspondence to the language string compressing unit 14 in FIG. 17. By providing the decompressing unit for each language, each language string derived separately per language from the separating unit 44 per language is decompressed on a language unit basis, thereby obtaining the original language string. A Unicode reproducing unit 54 is provided for the language string reconstructing unit 22. The language string per language obtained individually from the decompressing unit of each language is unified, thereby decompressing the original Unicode source data. Upon compression in FIG. 17, in the code unifying unit 42, language change information according to the discrimination result of the language in the row octet decoder 30 has been assembled in the compression data. Therefore, on the decompressing side in FIG. 18, by separating the language change information by the separating unit 44 per language, the language strings which are obtained in parallel by the Unicode reproducing unit 54 are combined and unified on the basis of the separated information, so that the Unicode source data can be obtained.

Figure 19:
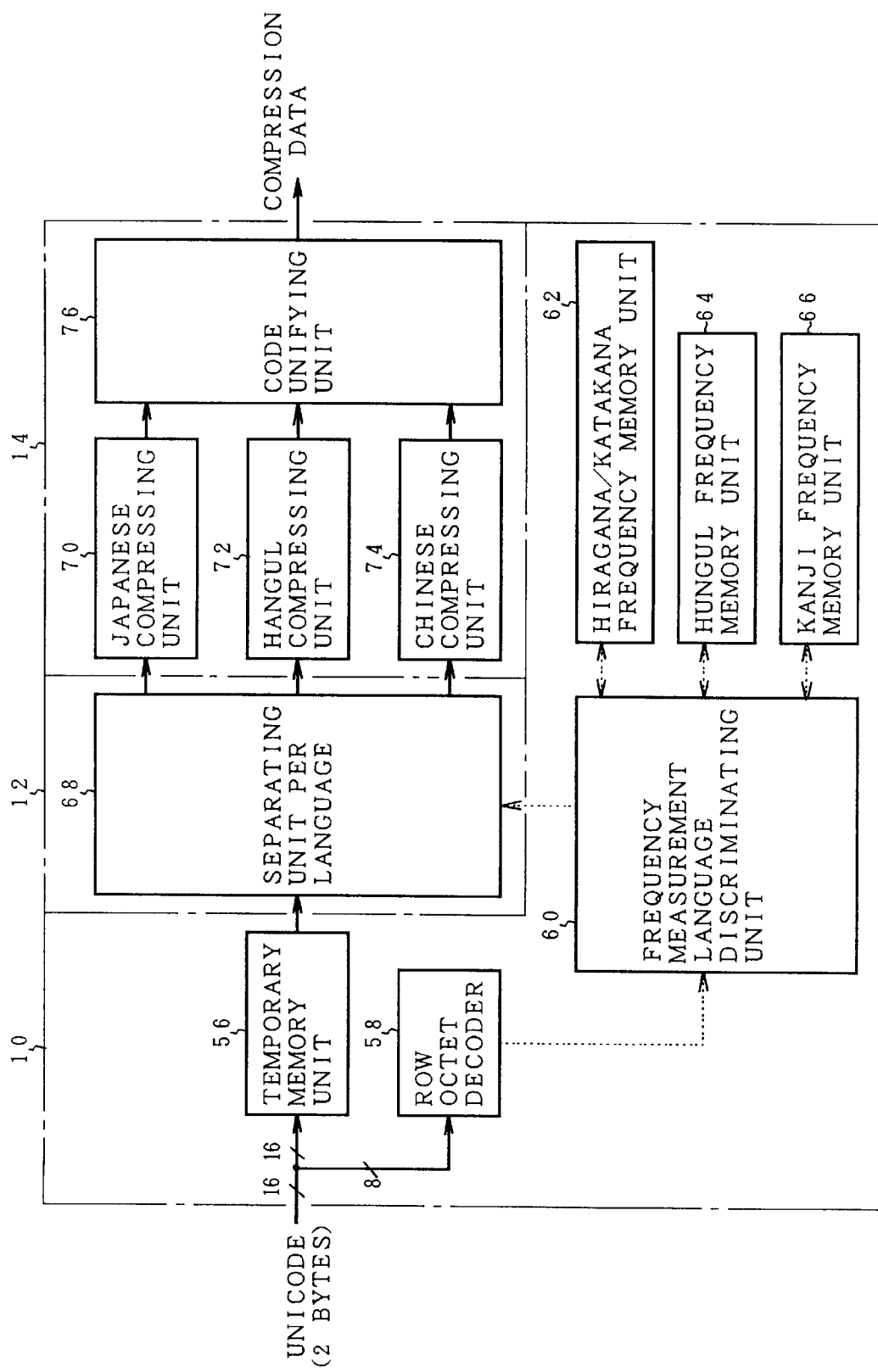
FIG. 19 is a block diagram of a data compressing apparatus for a Unicode Orient language source as a target.

FIG. 19 shows an embodiment of a data compressing apparatus in the case where the languages are limited to the Oriental languages in the Unicode. Japanese, Hangul, and Chinese are used as examples. A temporary memory unit 56, a row octet decoder 58, a frequency measurement language discriminating unit 60, a Hiragana/Katakana frequency memory unit 62, a Hangul frequency memory unit 64, and a Kanji frequency memory unit 66 are provided for the language discriminating unit 10. As for the discrimination of the language of the Oriental system in the language discriminating unit 10, first, Unicode source data is inputted and stored into the temporary memory unit 56 for a certain predetermined period of time, with respect to the data to be temporarily stored, the row octet is decoded by the row octet decoder 58, and a hysteresis of the result obtained by judging the kind of language is stored into each of the Hiragana/Katakana frequency memory unit 62, Hangul frequency memory unit 64, and Kanji frequency memory unit 66. When the decoding result of the row octet of the temporary memory data for a predetermined period of time by the row octet decoder 58 is obtained, whether the Unicode source data to be processed at present is Japanese, Hangul, or Chinese is judged by the appearance frequencies of Hiragana/Katakana, Hangul, and Kanji stored in the frequency memory units 62, 64, and 66 by the frequency measurement language discriminating unit 60. For example, when the appearance frequencies of Hiragana and Katakana are high, it is judged that the language is Japanese. When the appearance frequency of Hangul is high, it is judged that the language is Hangul. Further, in the case where the appearance frequencies of Hiragana, Katakana, and Hangul are almost equal to 0 and the appearance frequency of Kanji is high, it is possible to judge that the language is Chinese. On the basis of the discrimination result of the language kind of the frequency measurement language discriminating unit 60, a separating unit 68 per language provided for the language separating unit 12 inputs the Unicode source data stored in the temporary memory unit 56 and separates into each language string of the discriminated language of Japanese, Hangul, or Chinese. A Japanese compressing unit 70, a Hangul compressing unit 72, and a Chinese compressing unit 74 are provided for the language string compressing unit 14. Each language string of Japanese, Hangul, or Chinese separated by the language string separating unit 68 is individually inputted to each of the compressing units and is compressed by the Ziv-Lempel encoding, arithmetic encoding, or the like by using the dictionary or hysteresis of each language. A code unifying unit 76 unifies the compression data which is outputted from each of the compressing units 70, 72, and 74 into one bit stream and outputs it as compression data. In this instance, when the language discrimination result in the frequency measurement language discriminating unit 60 is switched, the language change information is inserted between the compression data of different languages.

Figure 20:
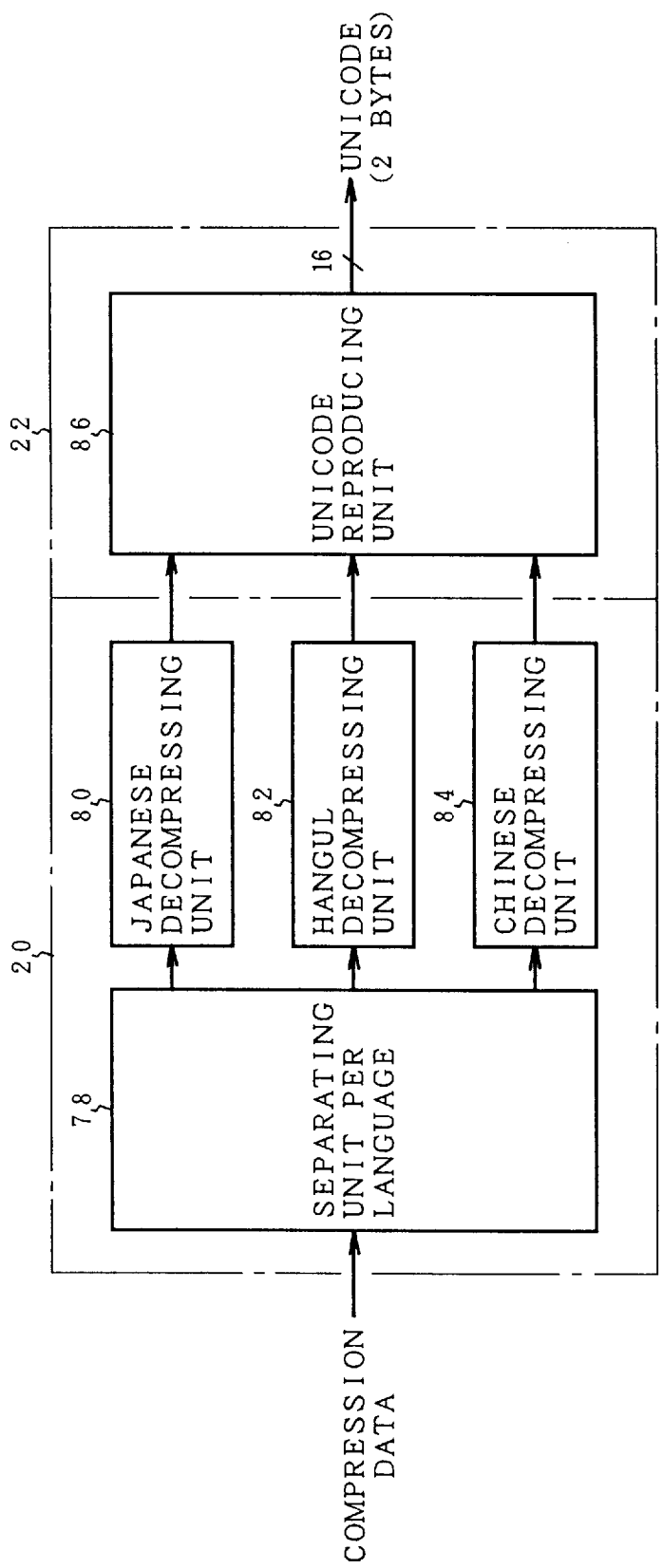
FIG. 20 is a block diagram of a data decompressing apparatus for a Unicode Orient language source as a target.

FIG. 20 shows an embodiment of a data decompressing apparatus for decompressing the original source data from the compression data compressed by the data compressing apparatus of FIG. 19. In the data decompressing apparatus, a separating unit 78 per language is provided for the language string decompressing unit 20. The compression data is inputted and separated into compression data strings of Japanese, Hangul, and Chinese. As for the separation in this case, the compression data can be separated by using the language change information included in the compression data. Subsequent to the separating unit 78 per language, a Japanese decompressing unit 80, a Hangul decompressing unit 82, and a Chinese decompressing unit 84 are provided. The compression data string of each language is inputted and the Unicode is decompressed on a language unit basis. A Unicode reproducing unit 86 is provided for the language string reconstructing unit 22. On the basis of the language change information separated by the separating unit 78 per language, the Unicode reproducing unit 86 couples the characters for each language string obtained from each of the decompressing units 80, 82, and 84, thereby reproducing the Unicode.

Figure 21:
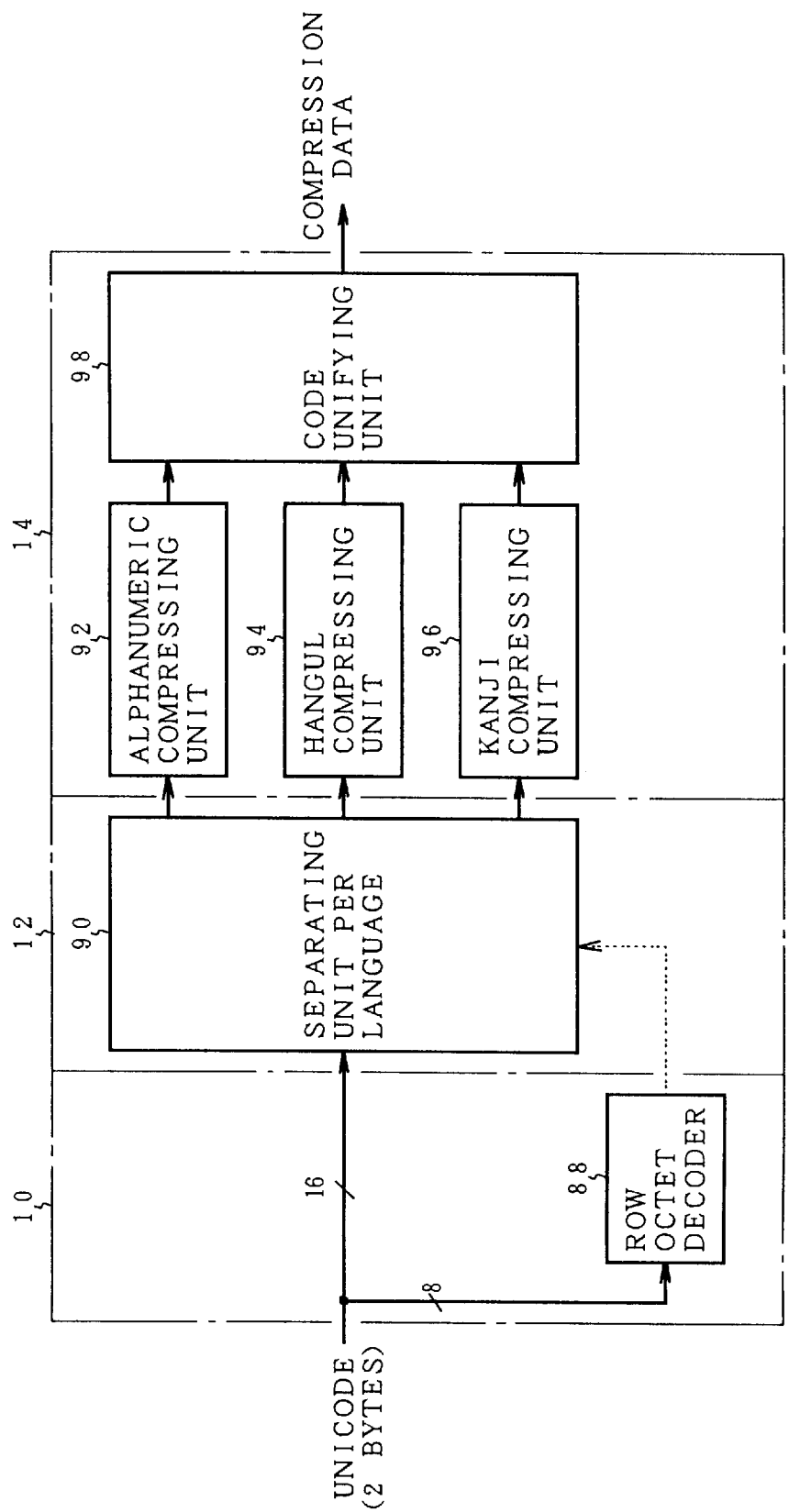
FIG. 21 is a block diagram of a data compressing apparatus for a Unicode Hangul source as a target.

FIG. 21 shows an embodiment of a data compressing apparatus in which Hangul is used as Unicode source data as a target. In the data compressing apparatus which is limited to Hangul, alphanumeric characters, Hangul, and Kanji which mixedly exist in Hangul are recognized by a row octet decoder 88 provided for the language discriminating unit 10. On the basis of the decoding result, the data is separated into alphanumeric character, Hangul, and Kanji by a separating unit 90 per language of the language separating unit 12. The character strings separated into alphanumeric characters, Hangul, and Kanji are individually compressed by an alphanumeric compressing unit 92, a Hangul compressing unit 94, and Kanji compressing unit 96 provided for the language compressing unit 14. Finally, the data is outputted as compression data of one bit stream including character kind switching information according to the discrimination result of the row octet decoder 88 by a code unifying unit 98.

Figure 22:
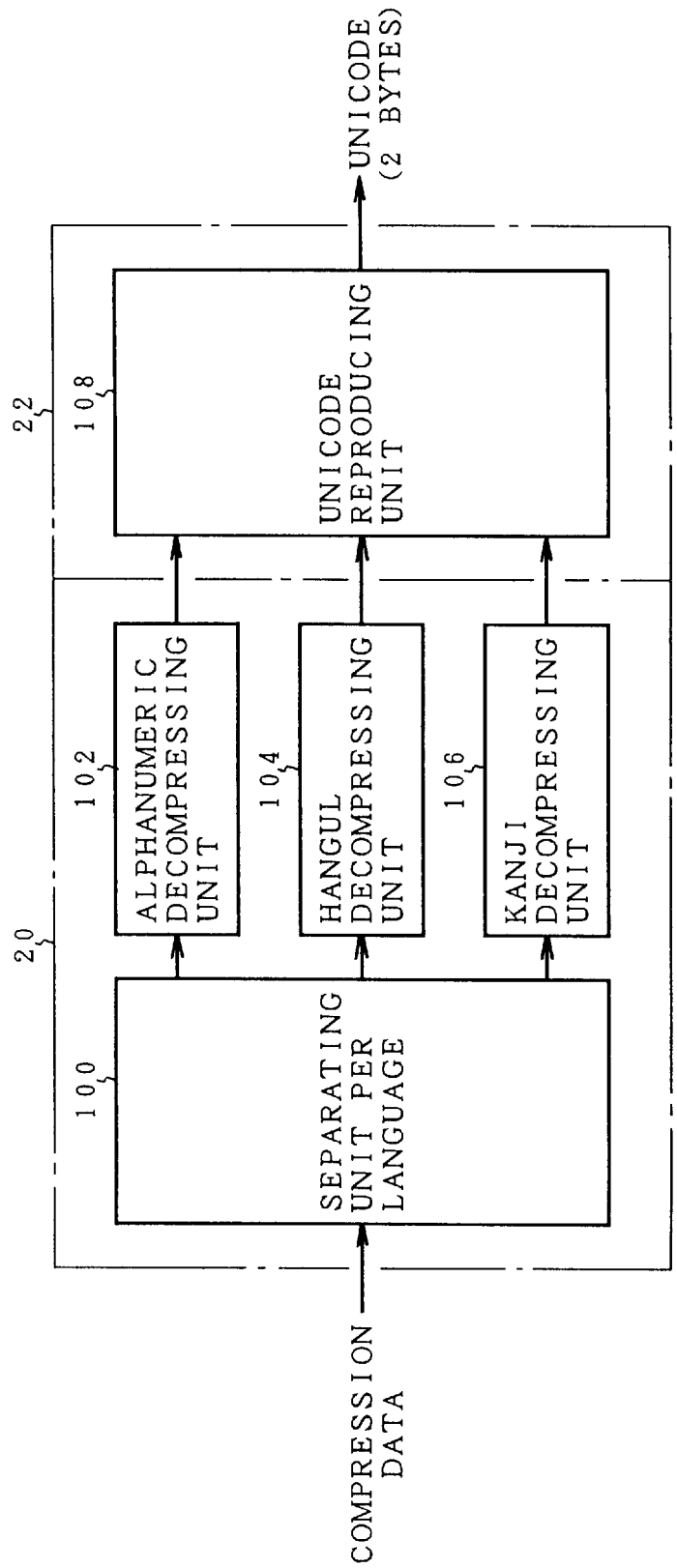
FIG. 22 is a block diagram of a data decompressing apparatus for a Unicode Hangul source as a target.

FIG. 22 shows an embodiment of a data decompressing apparatus for decompressing the original Unicode source data from the compression data obtained by the data compressing apparatus in which the language is limited to Hangul in FIG. 21. A language string separating unit 100 is provided for the language string decompressing unit 20 of the data decompressing apparatus. The language string separating unit 100 separates the data into alphanumeric character, Hangul, and Kanji by the character kind change information included in the compression data and outputs the compression data string. Subsequent to the language string separating unit 100, an alphanumeric decompressing unit 102, a Hangul decompressing unit 104, and Kanji decompressing unit 106 are provided and individually decompress the compression data strings separated every language. The decompressed character string of each decompressing unit is sent to a Unicode reproducing unit 108 provided for the language string reconstructing unit 22. By the selective coupling according to the character kind change information obtained from the compression data, the language string separating unit 100 reproduces the original Unicode data in which alphanumeric characters, Hangul, and Kanji mixedly exist.

Figure 23:
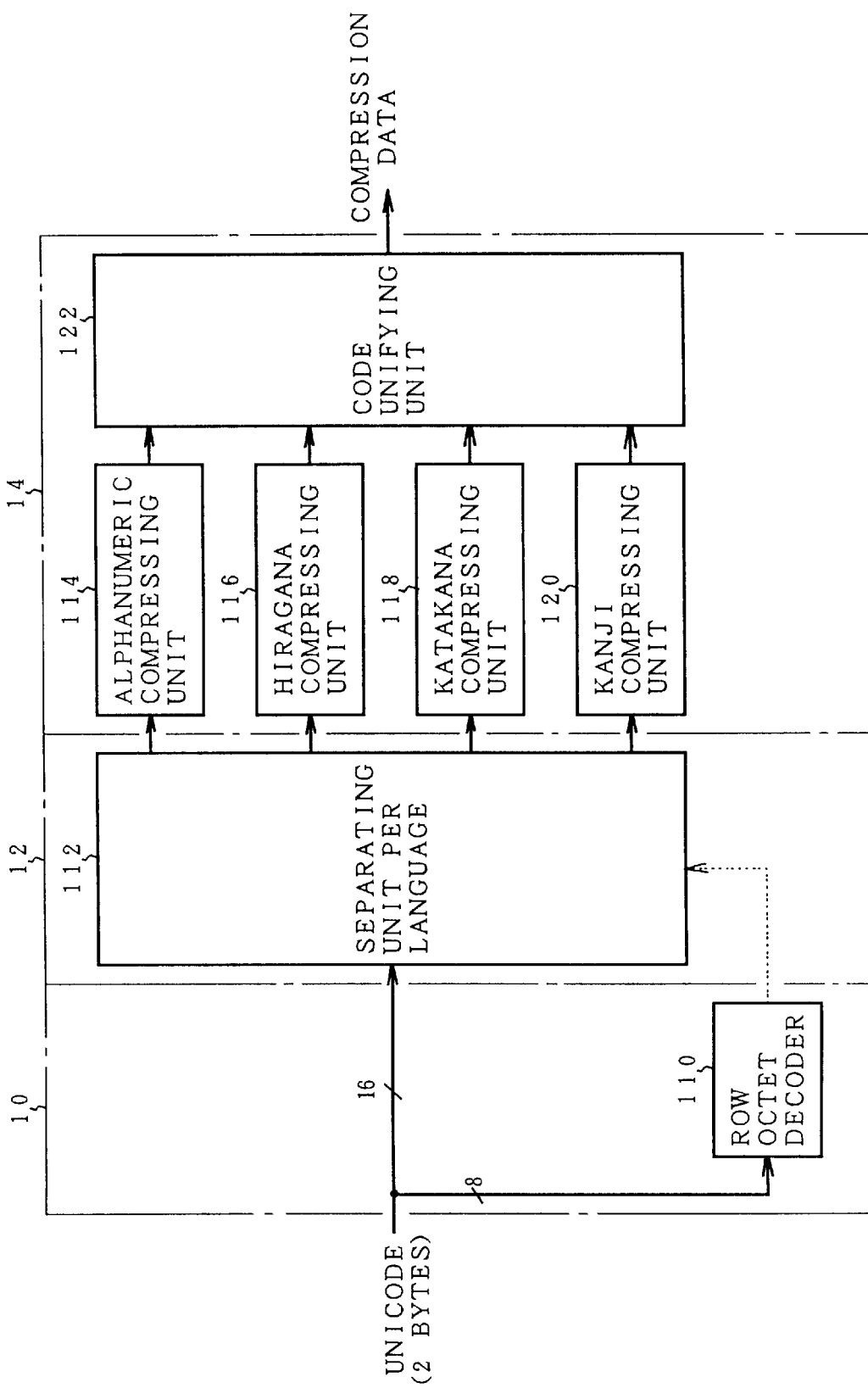
FIG. 23 is a block diagram of a data compressing apparatus for a Unicode Japanese source as a target.

FIG. 23 shows an embodiment of a data compressing apparatus in which Japanese of the Unicode source data is processed as a target. A row octet decoder 110 of the language discriminating unit 10 fetches the upper byte with respect to the 2-byte code of the Unicode source data in which Japanese is processed as a target, decodes the row octet, discriminates alphanumeric character, Hiragana, Katakana, and Kanji which mixedly exist in Japanese, supplies the discrimination results to a language string separating unit 112 of the language string separating unit 12, thereby allowing the language string separating unit 112 to separate the data into each character string of alphanumeric character, Hiragana, Katakana, and Kanji. An alphanumeric compressing unit 114, a Hiragana compressing unit 116, a Katakana compressing unit 118, and a Kanji compressing unit 120 are provided for the language string compressing unit 14 and individually compress each character string of alphanumeric character, Hiragana, Katakana, and Kanji separated by the language string separating unit 112. The compression data from the compressing units 114, 116, 118, and 120 is unified by a code unifying unit 122 and is outputted as compression data of one bit stream. When the compression data is unified, in order to designate a character kind switching among alphanumeric character, Hiragana, Katakana, and Kanji, the character kind change information based on the discrimination result of the row octet decoder 110 is inserted between the compression data of different character kinds.

Figure 24:
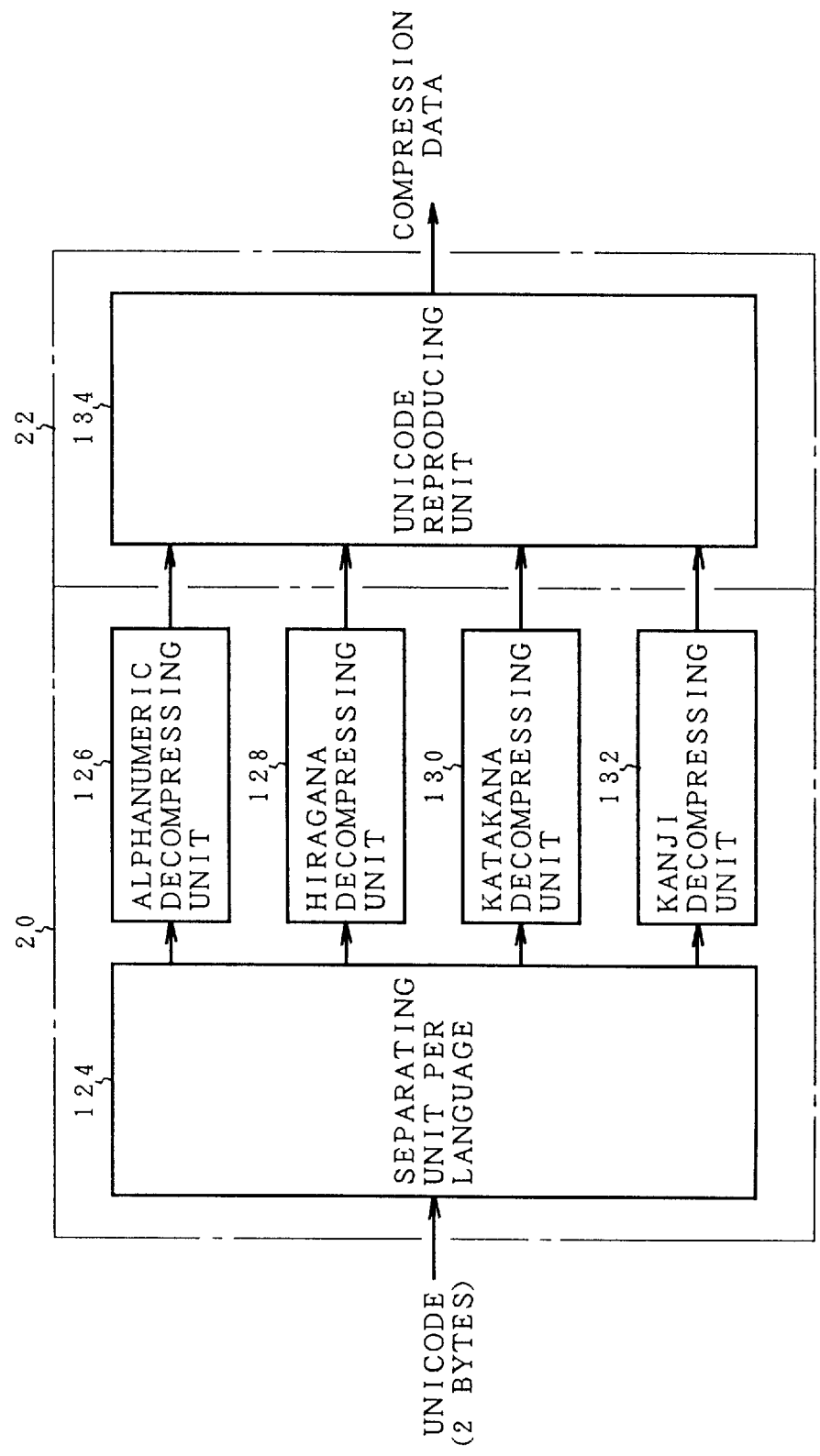
FIG. 24 is a block diagram of a data decompressing apparatus for a Unicode Japanese source as a target.

FIG. 24 shows an embodiment of a data decompressing apparatus for decompressing the original Japanese Unicode data from the compression data derived by the data compressing apparatus in FIG. 23. In the data decompressing apparatus, a separating unit 124 per language provided for the language string decompressing unit 20 separates the data into a compression data string of alphanumeric character, Hiragana, Katakana, or Kanji from the character kind change information included in the compression data. Subsequent to the separating unit 124 per language, an alphanumeric decompressing unit 126, a Hiragana decompressing unit 128, a Katakana decompressing unit 130, and a Kanji decompressing unit 132 are provided and decompress the data on a character kind unit basis. The decompression data obtained by the decompressing units 126, 128, 130, and 132 is supplied to a Unicode reproducing unit 134 provided for the language string reconstructing unit 22. The language source data is reproduced by the selective coupling of the decompressed character string according to the character kind change information included in the compression data separated by the separating unit 124 per language.

[Compression and decompression of Japanese code]

(1) Compression and decompression for every different byte construction

Figure 25:
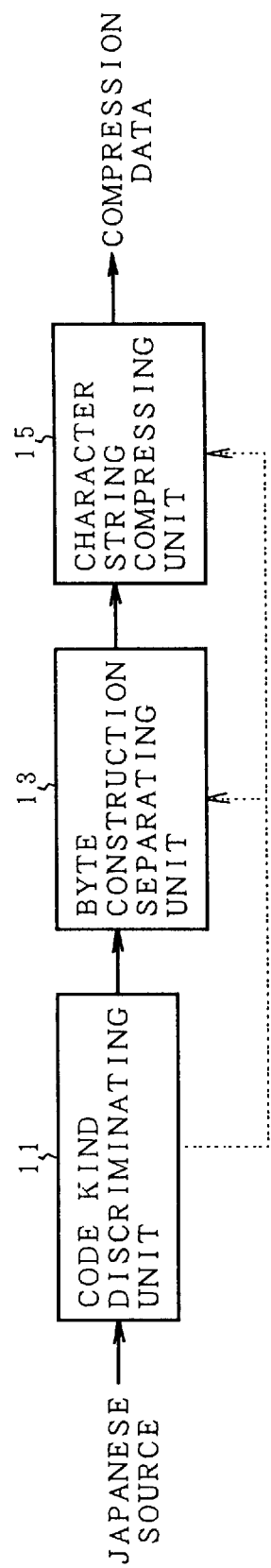
FIG. 25 is a block diagram of a data compressing apparatus of the invention in which a Japanese code is compressed as a target every character string of a different byte construction.

Several character codes which are peculiar to Japanese also exist separately from the Unicode of the international standard in FIGS. 13, 14, and 15. As character codes which are peculiar to Japanese, for example, there are JIS Kanji code, shift JIS code, EUC code, and the like and there are an all 2-byte construction and a byte construction in which one byte and two bytes mixedly exist. A data compressing apparatus of FIG. 25 is characterized in that the source data using the character code that is peculiar to Japanese is compressed and the compression and decompression are executed on a different byte unit basis for Japanese source data of different byte constructions. The data compressing apparatus is constructed by a code kind discriminating unit 11, a byte construction separating unit 13, and a character string compressing unit 15. The code kind discriminating unit 11 discriminates, for example, the JIS code, EUC code, JEF code, or the like as a character code that is peculiar to Japanese. The Unicode which has already been described can be also obviously included as a kind into the code that is peculiar to Japanese. The byte construction separating unit 13 detects the byte construction of the character code on the basis of code kind ID information discriminated by the code kind discriminating unit 11 and separates into a plurality of kinds of character strings of different byte constructions. The character string compressing unit 15 individually compresses every plurality of kinds of character strings of different byte constructions separated by the byte construction separating unit 13.

Figure 26:
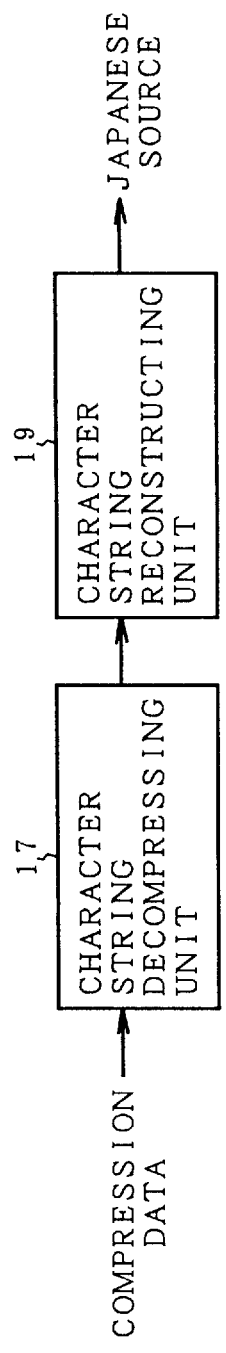
FIG. 26 is a block diagram of a data decompressing apparatus of the invention in which data obtained by compressing the Japanese code as a target every character string of the different byte construction is decompressed.

FIG. 26 shows an embodiment of a data decompressing apparatus for decompressing the original Japanese source data from the compression data compressed on a byte construction unit basis in FIG. 25. The data decompressing apparatus is constructed by a character string decompressing unit 17 and a character string reconstructing unit 19. The character string decompressing unit 17 inputs the compression data and outputs the compression data string separated every byte construction. Byte construction change information corresponding to the code kind ID information discriminated by the code kind discriminating unit 11 in FIG. 25 has been inserted in the compression data upon compression. In accordance with the byte construction change information in the compression data, therefore, the character string decompressing unit 17 separates the data into a compression data string of each of a plurality of kinds of different byte constructions, thereby individually decompressing. The character string reconstructing unit 19 couples the character strings of different byte constructions decompressed by the character string decompressing unit 17 into one character string, thereby reconstructing the character string of the original Japanese source data.

Figure 28:
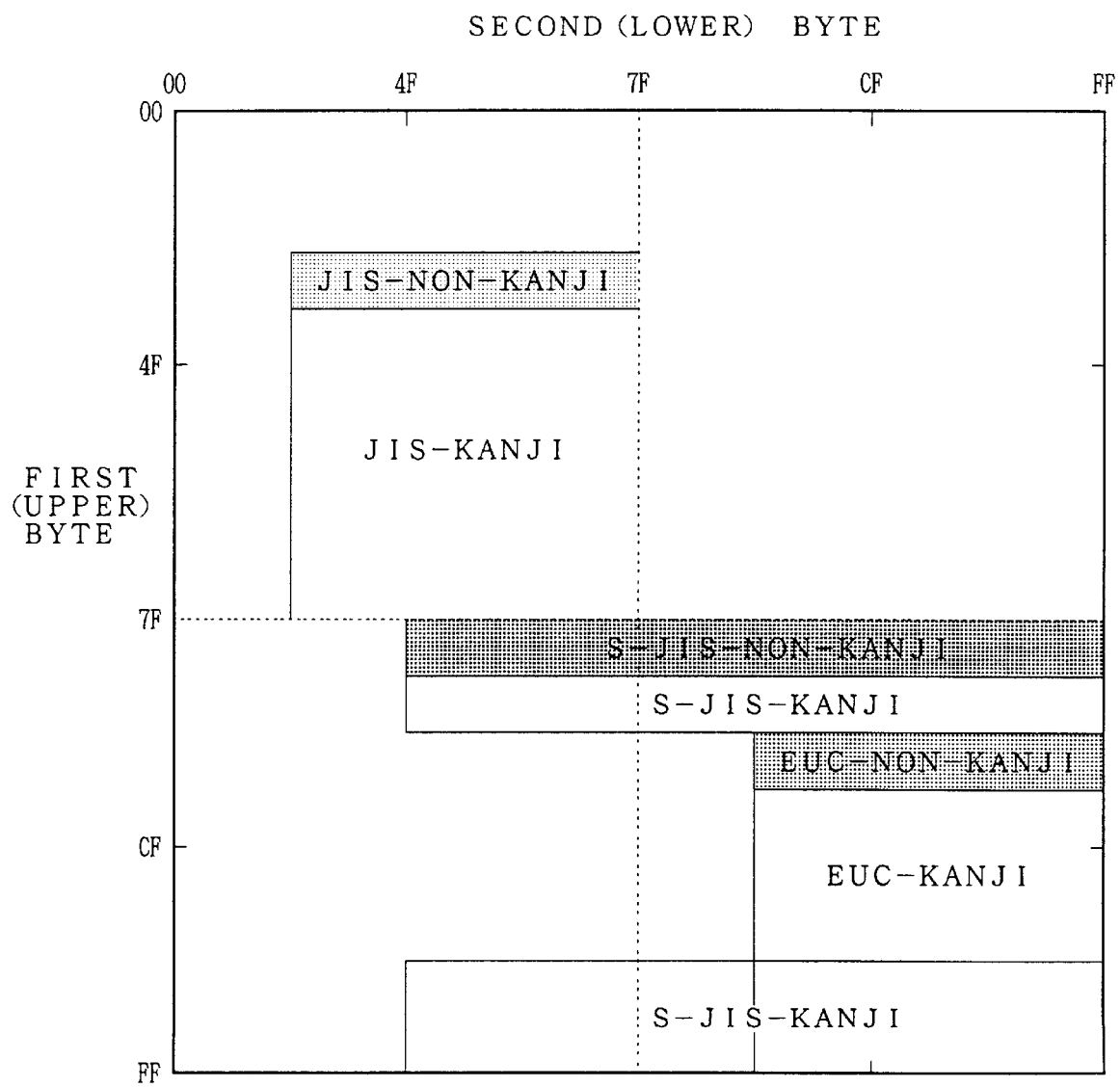
FIG. 28 is an explanatory diagram of a Japanese code space.

FIG. 27 shows the number of characters and byte constructions of the JIS Kanji code, shift JIS code, and EUC code as Japanese character codes which are treated by the data compressing apparatus of FIG. 25 and the data decompressing apparatus in FIG. 26. FIG. 28 shows an allocation of the JIS Kanji code, shift JIS code, and EUC code in a 2-dimensional character code space of the first byte (upper byte) and the second byte (lower byte) with respect to the 2-byte construction of the Japanese character code. With respect to the JIS Kanji code, shift JIS code, and EUC code in FIGS. 27 and 28, for example, by extracting characters on a byte unit basis and judging a deviation among the appearance frequencies in the Japanese character code space in FIG. 28, the code kind can be identified.

Figure 29:
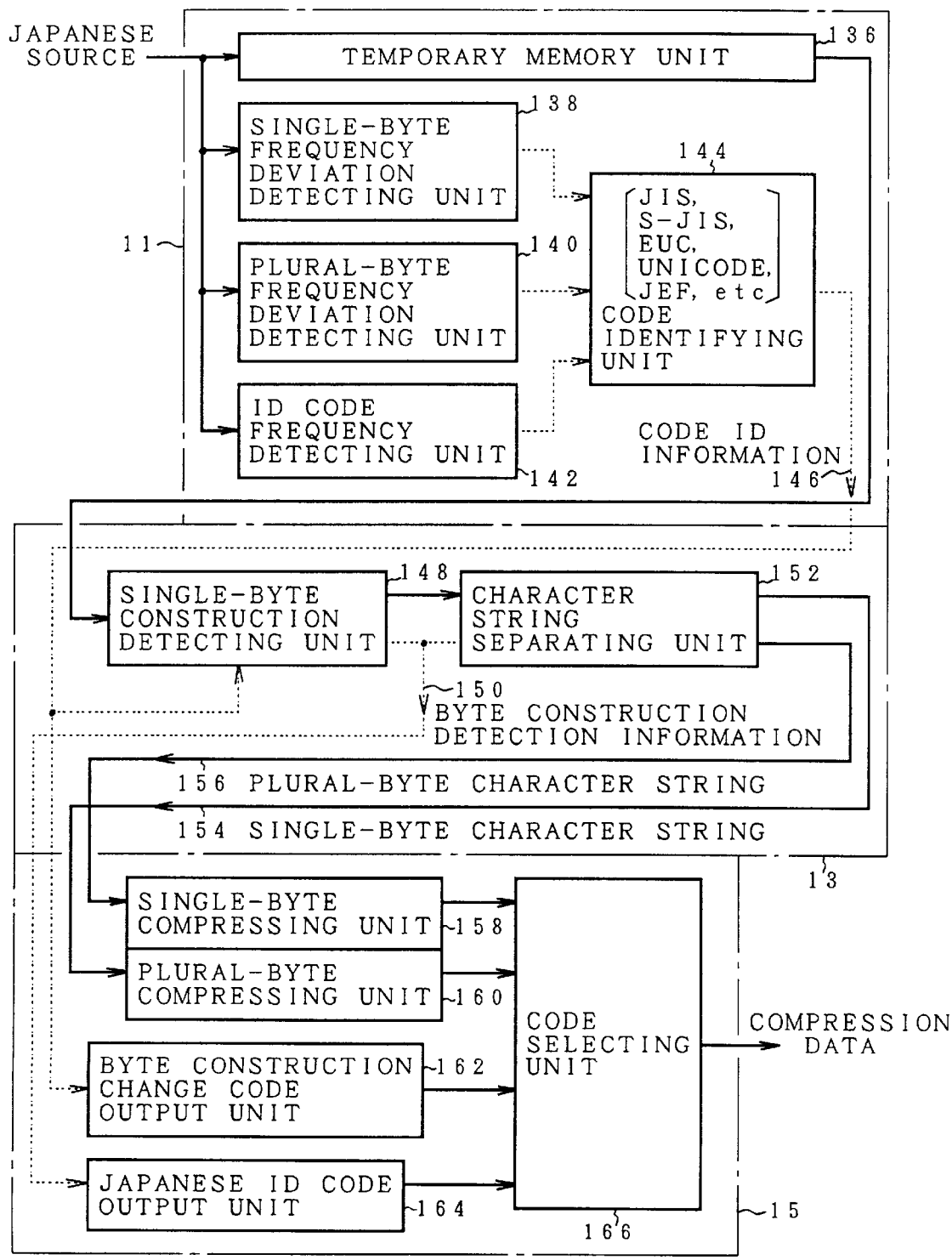
FIG. 29 is a detailed block diagram of the data compressing apparatus in FIG. 25.

FIG. 29 shows a specific embodiment of the data compressing apparatus of FIG. 25. The code kind discriminating unit 11 has a temporary memory unit 136, a single-byte frequency deviation detecting unit 138, a plural-byte frequency deviation detecting unit 140, an ID code frequency detecting unit 142, and a code identifying unit 144. Namely, data in a predetermined interval of the Japanese source data is inputted and stored into the temporary memory unit 136. Upon storage, a deviation of the frequency of the single byte, a deviation of the frequency of the plural-byte, and a frequency of the ID code are detected by the single-byte frequency deviation detecting unit 138, plural-byte frequency deviation detecting unit 140, and ID code frequency detecting unit 142 with respect to the predetermined interval, respectively. By such a frequency detection, the deviation among the appearance frequencies in the character code space that is peculiar to Japanese in FIG. 28 is known. From the deviation of the frequencies, which one of the code kinds of JIS Kanji, shift JIS, and EUC allocated into the character code space can be identified. Code ID information 146 indicative of the identification result is outputted. A method of discriminating the code kind by the detection of the deviation of the frequencies will be further described in detail. An appearance frequency of each code corresponding to fullwidth, Hiragana, Katakana, alphanumeric character, and symbol (especially, space, comma, general punctuation, etc.) in the Japanese source data in a certain predetermined interval to be accumulated into the temporary memory unit 136 is detected every single byte or every plural bytes. The code kind of the Japanese source data is discriminated from the deviation in the Japanese character code space in FIG. 28 of the detected frequency. As another code kind discriminating method, it is also possible to construct in a manner such that a frequency of each code corresponding to halfwidth, Katakana, alphanumeric character, and symbol (particularly, space, comma, general punctuation, etc.) in the Japanese source data in a predetermined interval stored in the temporary memory unit 136 is likewise detected every single byte and that the code kind of the Japanese source data is discriminated by the deviation of the frequency in a one dimension of the lower byte of an axis of abscissa in FIG. 28. A single-byte construction detecting unit 148 and a character string separating unit 152 are provided for the next byte construction separating unit 13 of the code kind discriminating unit 11. The single-byte construction detecting unit 148 recognizes the character code kind as a processing target on the basis of the code kind information 146 outputted from the code identifying unit 144 and detects whether one character consists of a single byte or two bytes. The character string separating unit 152 separates into characters of a single byte and plural bytes (two bytes) on the basis of the detection result by the single-byte construction detecting unit 148, namely, byte construction detection information 150 and outputs a single-byte character string 154 and a plural-byte character string 156. As for the separation of the character string per byte construction by the single-byte construction detecting unit 148 and character string separating unit 152, if the JIS Kanji code, shift JIS Kanji code, or EUC (expanded UNIX) code is known by the code ID information 146, a separating process by the recognition of each peculiar byte construction can be performed. For example, in the case where the Japanese source code identified by the code ID information 146 is the JIS Kanji code, by a special switching code, the following code can be recognized.

I. 1-byte code of JIS (halfwidth—alphanumeric character, Katakana, etc.)

II. 2-byte code of JIS (fullwidth—alphanumeric character, Katakana, Hiragana, Kanji, etc.)

Therefore, it is sufficient to separate the character string of JIS Kanji code every byte construction by the special switching code. In the case where the Japanese source data is the shift JIS Kanji code, by decoding the first byte, whether the code is a 1-byte code or a 2-byte code can be known. That is, I. In the case where the first byte is 21H~7EH, A1H~DFH as a hexadecimal notation, it is a 1-byte code of shift JIS II. In the case where the first byte is 81H~9FH, E0H~FCH as a hexadecimal notation, it is a 2-byte code of shift JIS Therefore, by decoding the first byte of the hexadecimal notation, it is possible to easily separate into the 1-byte code and 2-byte code. Further, in the case where the Japanese source data is an EUC (expanded UNIX) code, I. In the case where the head bit (upper bit) of each byte is equal to 0, it is a 1-byte code of ASCII II. In the case where the head bit (upper bit) of each byte is equal to 1, it is a 2-byte code of JIS In this case, it is also possible to similarly separate into the 1-byte code string and the 2-byte code string by decoding the head bit (upper bit) of each byte. A single-byte compressing unit 158, a plural-byte compressing unit 160, a byte construction change code output unit 162, a Japanese ID code output unit 164, and a code selecting unit 166 are provided for the next character string compressing unit 15 of the byte construction separating unit 13. Namely, the single-byte character string 154 separated by the character string separating unit 152 is compressed by the single-byte compressing unit 158. The plural-byte character string 156 is compressed by the plural-byte compressing unit 160. The byte construction change code output unit 162 monitors a change from the detection of the single-byte construction to the detection of the plural-byte construction by the code ID information 146 or a change opposite to such a change. When the byte construction changes, the output unit 162 outputs a byte construction change code. The Japanese ID code output unit 164 outputs the code kind information such as JIS, shift JIS, EUC, or the like identified on the basis of the code ID information 146. Further, in the invention, since the Unicode is also included in the processing target and the Unicode is an international standard code, with respect to the other codes, a code indicative of the code that is peculiar to Japanese is also outputted. The code selecting unit 166 adds the Japanese ID code outputted from the Japanese ID code output unit 164 to the head position of the compression data and arranges single-byte compression data or plural-byte compression data after the Japanese ID code. The byte construction change code outputted from the byte construction change code output unit 162 is inserted at the time of the switching from the single-byte compression data to the plural-byte compression data or, contrarily, at the time of the switching from the plural-byte compression data to the single-byte compression data. Compression data is outputted as one bit stream data in which they are selectively coupled. In such a data compressing apparatus in which the Japanese source data is treated as a target, in the case where the characters of different byte constructions such as single byte and plural bytes mixedly exist, by converting into the character string of the same byte construction separated every different byte construction and performing the compression and decompression, characters having similar statistic natures can be collected and compressed. Thus, a compressing performance in the Ziv-Lempel or arithmetic encoding can be effectively derived. Thus, the compressing performance can be raised.

Figure 30:
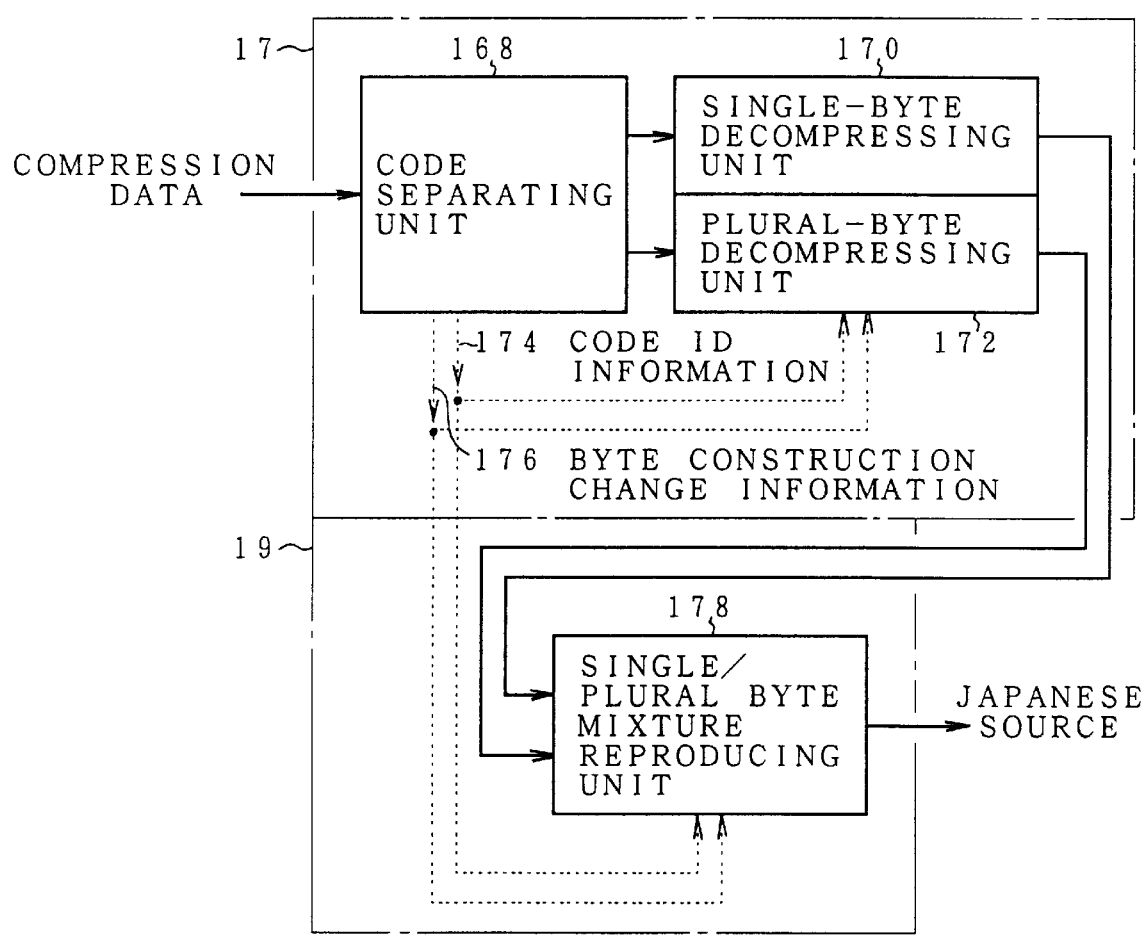
FIG. 30 is a detailed block diagram of the data decompressing apparatus in FIG. 26.

FIG. 30 shows a detailed embodiment of a data decompressing apparatus for decompressing the original Japanese source data from the compression data obtained by separating and compressing every byte construction in FIG. 29, namely, the data decompressing apparatus shown in FIG. 26. The data decompressing apparatus is constructed by the character string decompressing unit 17 and character string reconstructing unit 19. A code separating unit 168 is provided for the character string decompressing unit 17. On the basis of the Japanese ID code included at the head position of the compression data, the code separating unit 168 separates code ID information 174 indicative of the JIS code, shift JIS code, EUC code, or the like. The code separating unit 168 also separates byte construction change information 176 indicative of a change in byte construction in the compression data. Further, in accordance with the byte construction change information 176, the code separating unit 168 separates each of the single-byte compression data and plural-byte compression data included in the compression data and outputs to corresponding single-byte decompressing unit 170 and plural-byte decompressing unit 172. In accordance with the Ziv-Lempel decoding or arithmetic decoding, the single-byte decompressing unit 170 and plural-byte decompressing unit 172 execute a decompressing process with respect to the compression data strings of the same byte construction. A single/plural byte mixture reproducing unit 178 is provided for the character string reconstructing unit 19. The single/plural byte mixture reproducing unit 178 selectively couples the decompressed characters which are outputted from the single-byte decompressing unit 170 and plural-byte decompressing unit 172 in accordance with the code kind information 174 and byte construction change information 176 outputted from the code separating unit 168 and reproduces the original Japanese source data in which the single-byte character and plural-byte character mixedly exist.

(2) Compression and decompression of every different character kind

FIG. 31 shows an embodiment of a data compressing apparatus for separating a character string every character kind such as alphanumeric character, Hiragana, Katakana, or the like in a code for the character code that is peculiar to Japanese as a target and individually compressing. The data compressing apparatus is constructed by a code kind discriminating unit 21, a character kind separating unit 23, and a character string compressing unit 25. The code kind discriminating unit 21 is the same as the code kind discriminating unit 11 in case of separately compressing every byte construction in FIG. 25 and discriminates the code kind such as JIS code, shift JIS code, EUC code, or the like from the Japanese source data. The character kind separating unit 23 recognizes the character kinds such as halfwidth alphanumeric character, Katakana, Hiragana, and others and fullwidth alphanumeric character, Katakana, Hiragana, Kanji, and others by each character code, thereby forming a character string separated every character kind. The character string compressing unit 25 has a compressing unit of each character kind separated by the character kind separating unit 23, unifies the data which was individually compressed with respect to the character string of the same character kind, and outputs the unified data as compression data.

FIG. 32 shows an embodiment of a data decompressing apparatus for decompressing the original Japanese source data from the compression data obtained by individually compressing the character string separated every character kind in FIG. 31. The data decompressing apparatus is constructed by a character string decompressing unit 27 and a character string reconstructing unit 29. The character string decompressing unit 27 recognizes the switching of the character kind from the character kind change information inserted in the compression data on the compressing side, forms the compression data string obtained by separating the compression data every character kind, and decompresses the compression data of each character kind in a decompressing unit provided every character kind. The character string decompressed every character kind is supplied to the character string reconstructing unit 29. By the selective coupling according to the character kind change information separated from the compression data, the original Japanese source data in which a plurality of character kinds mixedly exist is decompressed.

Figure 33A:
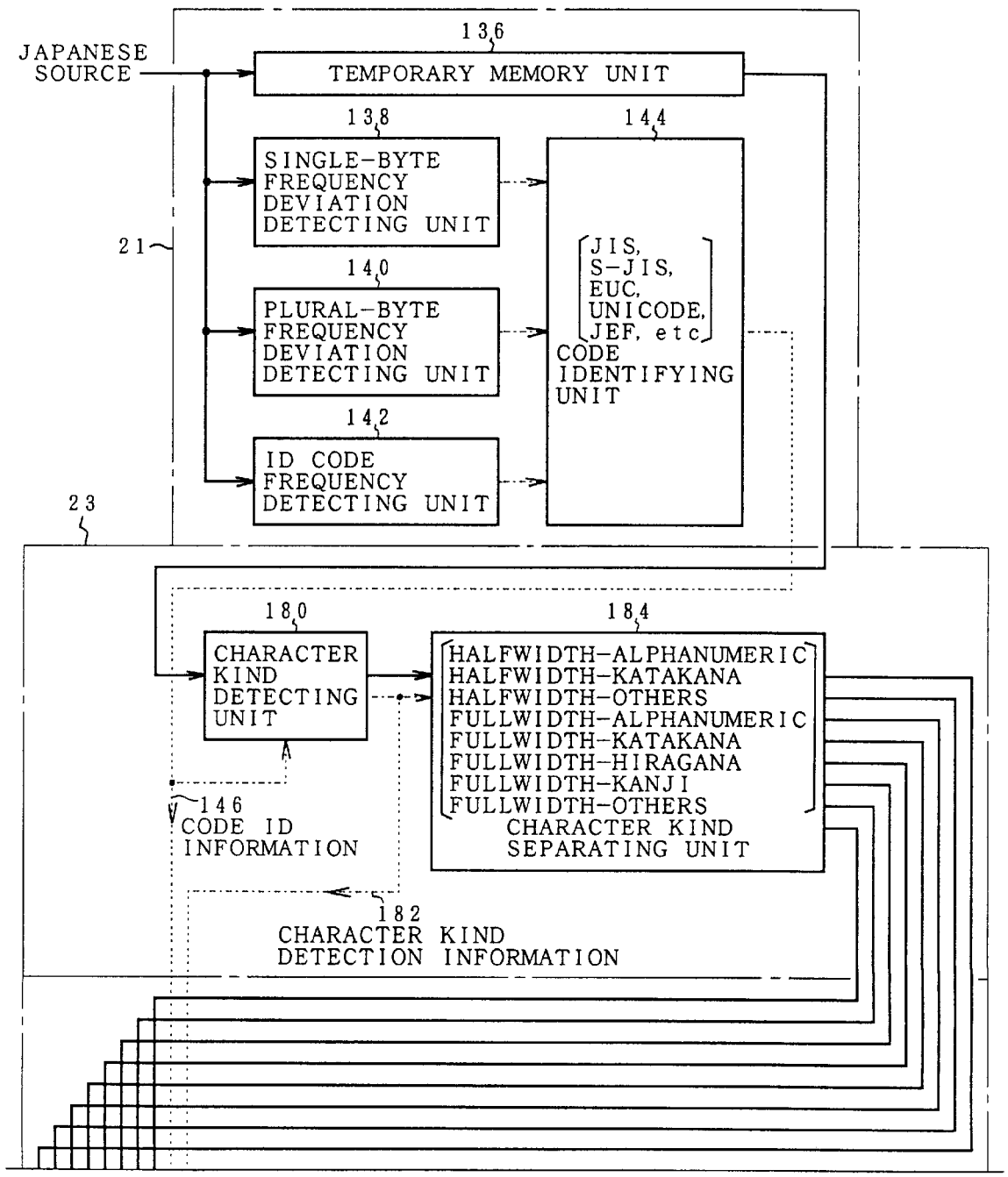
FIG. 33 is a detailed block diagram of the data compressing apparatus in FIG. 31.
Figure 33B:
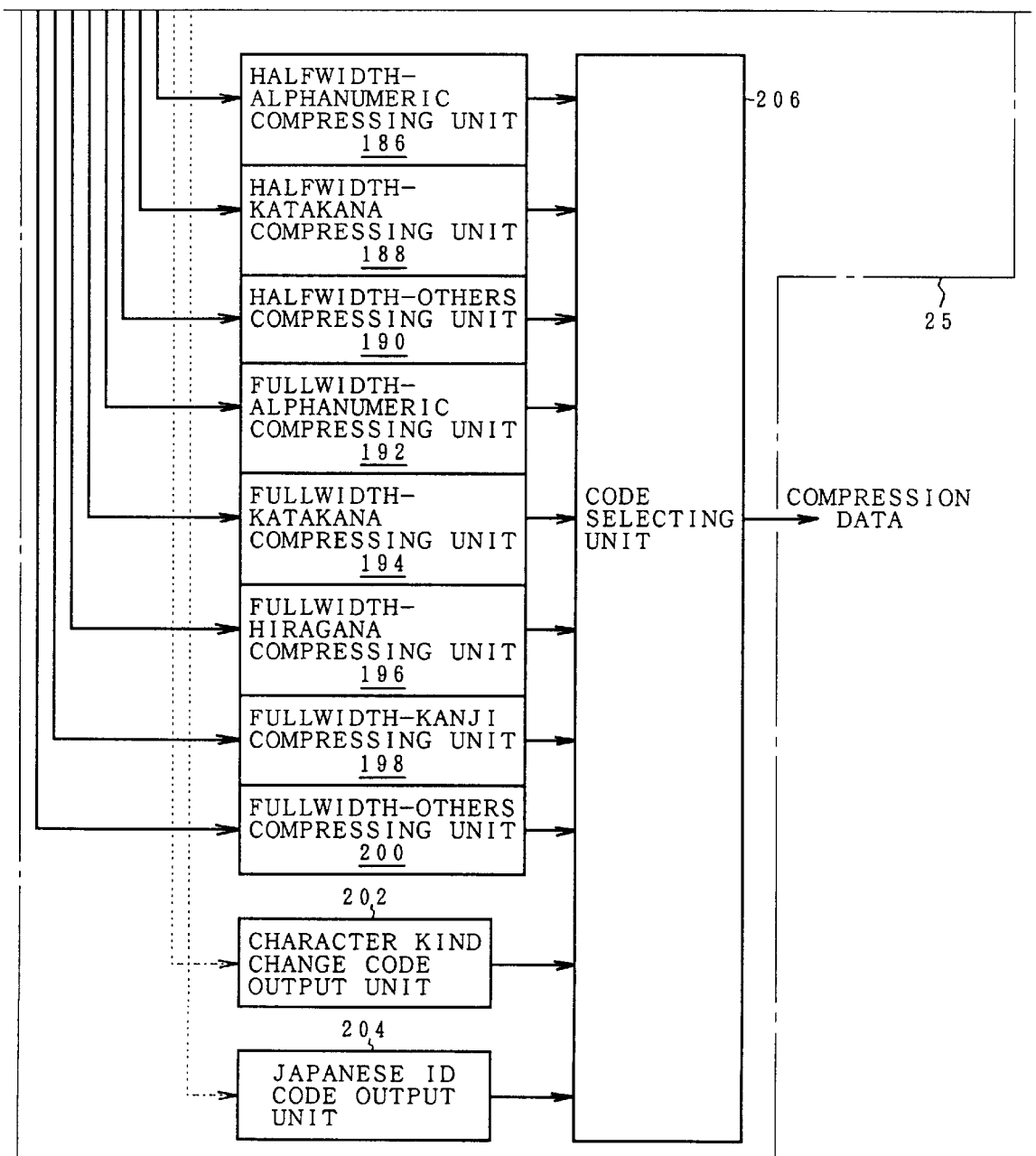

FIG. 33 shows a specific embodiment of the data compressing apparatus for separating and compressing every character kind in FIG. 31. First, in a manner similar to the embodiment for separately compressing every byte construction in FIG. 29, the code kind discriminating unit 21 is constructed by the temporary memory unit 136, single-byte frequency deviation detecting unit 138, plural-byte frequency deviation detecting unit 140, frequency detecting unit 142, and code identifying unit 144 and outputs the code ID information 146 indicating that the inputted Japanese source data is which one of JIS, shift JIS, EUC, or the like. A character kind detecting unit 180 and a character kind separating unit 184 are provided for the next character kind separating unit 23 of the code kind discriminating unit 21. The character kind detecting unit 180 extracts the Japanese source data inputted via the temporary memory unit 136 on a byte unit basis, detects which one of the character kinds such as halfwidth alphanumeric character, halfwidth Katakana, halfwidth others, fullwidth alphanumeric character, fullwidth Katakana, fullwidth Hiragana, fullwidth Kanji, and fullwidth others from the code, and outputs character kind detection information 182 indicative of the detection result. The character kind separating unit 184 separates into the character string of only the detected character kind on the basis of the character kind detection information 182 from the character kind separating unit 180 and outputs to the character string compressing unit 25. As a compressing unit corresponding to each character kind, a halfwidth alphanumeric compressing unit 186, a halfwidth Katakana compressing unit 188, a halfwidth others compressing unit 190, a fullwidth alphanumeric compressing unit 192, a fullwidth Katakana compressing unit 194, a fullwidth Hiragana compressing unit 196, a fullwidth Kanji compressing unit 198, and a fullwidth others compressing unit 200 are provided for the character string compressing unit 25 and individually compress various character strings. A character kind change code output unit 202 is provided and outputs a character kind change code when a change in character kind detection information 182 from the character kind separating unit 23 is recognized. Further, a Japanese ID code output unit 204 is also provided and outputs a Japanese ID code in which the source data is Japanese and which indicates a code kind such as JIS, shift JIS, EUC, or the like on the basis of the code ID information 146 from the code kind discriminating unit 21. The code selecting unit 206 executes the code selection for providing the compression data and character kind change code of each character kind which are outputted from the compressing units 186, 188, . . . , and 200 for every character kind and, further, the Japanese ID code to the head position of the compression data, and outputs as compression data as one bit stream.

Figure 34:
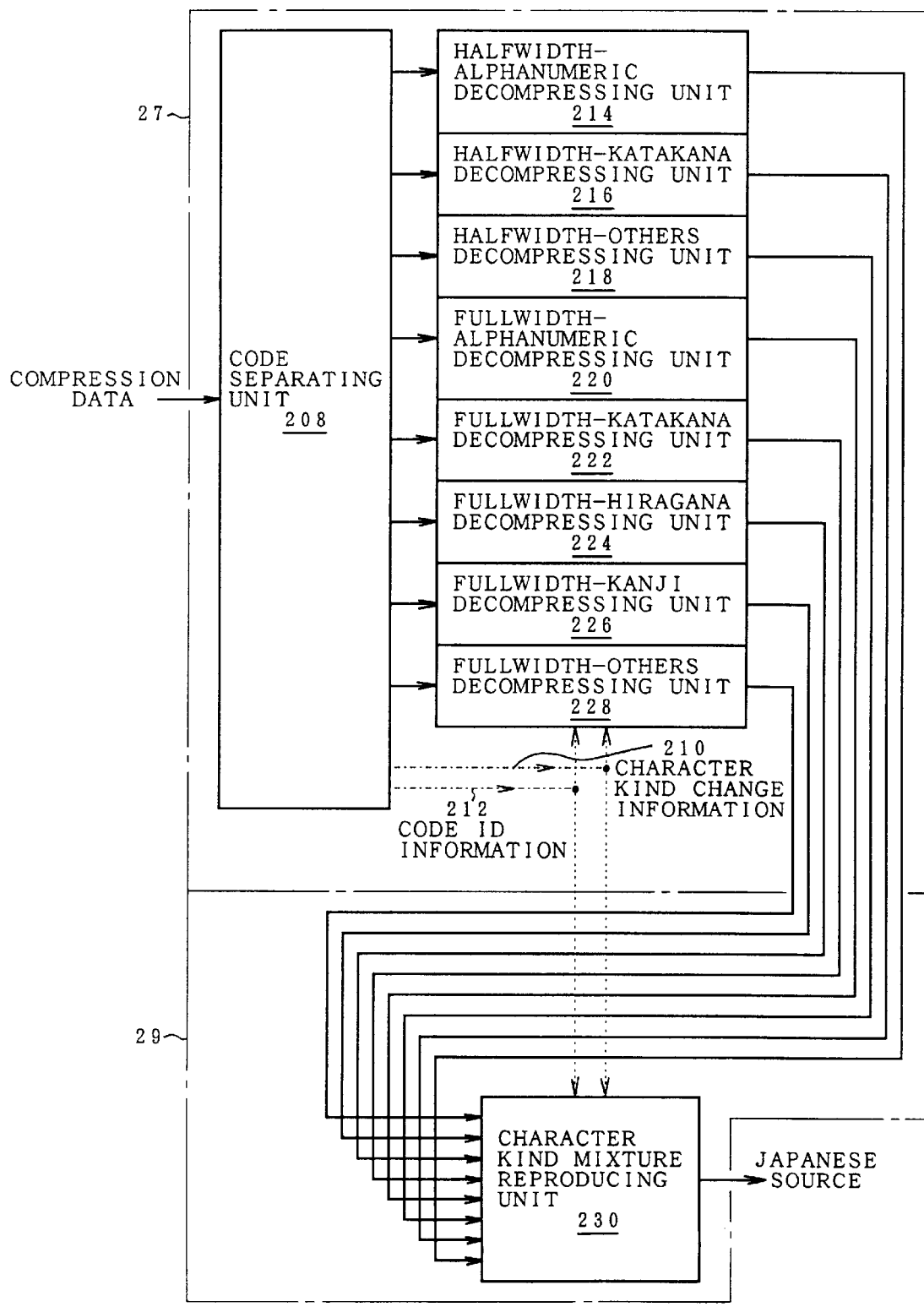
FIG. 34 is a detailed block diagram of the data decompressing apparatus in FIG. 32.

FIG. 34 shows an embodiment of a data decompressing apparatus of FIG. 32 for decompressing the original Japanese source data from the compression data obtained by separating and compressing every character kind. A code separating unit 208 is provided for the character string decompressing unit 27. As a decompressing unit for every character kind, a halfwidth alphanumeric decompressing unit 214, a halfwidth Katakana decompressing unit 216, a halfwidth others decompressing unit 218, a fullwidth alphanumeric decompressing unit 220, a fullwidth Katakana decompressing unit 222, a fullwidth Hiragana decompressing unit 224, a fullwidth Kanji decompressing unit 226, and a fullwidth others decompressing unit 228 are provided for the character string decompressing unit 27. The code separating unit 208 separates code ID information 212 from the Japanese ID code arranged at the head of the compression data and outputs character kind change information 210 from a character kind change code inserted in a switching unit portion of the compression data of each character kind in the compression data. The code separating unit 208 recognizes the contents of each character kind in the compression data in accordance with the character kind change code included in the compression data, separates every character kind in accordance with the recognized contents, and outputs to each decompressing unit. The character string of each character kind such as alphanumeric character, Katakana, or the like decompressed by the character string decompressing unit 27 is supplied to a character kind mixture reproducing unit 230 provided for the character string reconstructing unit 29. The character kind mixture reproducing unit 230 recognizes the code kind of the Japanese source data to be decompressed on the basis of the code ID information 212 separated from the head of the compression data. Further, the character kind mixture reproducing unit 230 selects the character string of each character kind decompressed by the character kind change information 210 separated by the code separating unit 208 and couples them, thereby reproducing the Japanese source data in which a plurality of character kinds mixedly exist and which is one bit stream. As mentioned above, by individually compressing the character string separated every different character kind in the code in the Japanese source data, the compression is executed every same character kind in which statistic natures are similar, and the encoding ability in the Ziv-Lempel encoding or arithmetic encoding can be sufficiently derived, so that a high compressing performance can be realized.

(3) Compression and decompression by byte unification

Figure 35:
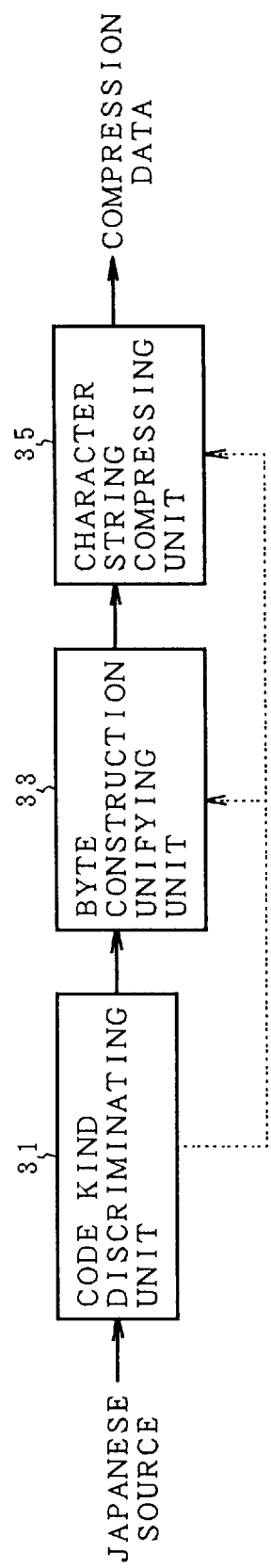
FIG. 35 is a block diagram of a data compressing apparatus of the invention in which a Japanese code is compressed as a target by unifying the byte constructions.

FIG. 35 shows an embodiment of a data compressing apparatus in which the Japanese source data is processed as a target and is characterized in that data of a plurality of kinds of byte constructions are unified into the data of one byte construction and, after that, the unified data is compressed. The data compressing apparatus is constructed by a code discriminating unit 31, a byte construction unifying unit 33, and a character string compressing unit 35. The code discriminating unit 31 discriminates that the Japanese source data is the JIS code, shift JIS code, EUC code, JEF code, Unicode, or the like and outputs the code ID information. The byte construction unifying unit 33 executes processes for recognizing the contents of the byte construction used in the discriminated code from the code kind discriminated by the code kind discriminating unit 31 and unifying into the byte construction of the maximum number of bytes among the byte constructions using the characters of different byte constructions. The character string compressing unit 35 compresses the character string unified into one byte construction by the byte construction unifying unit 33.

Figure 36:
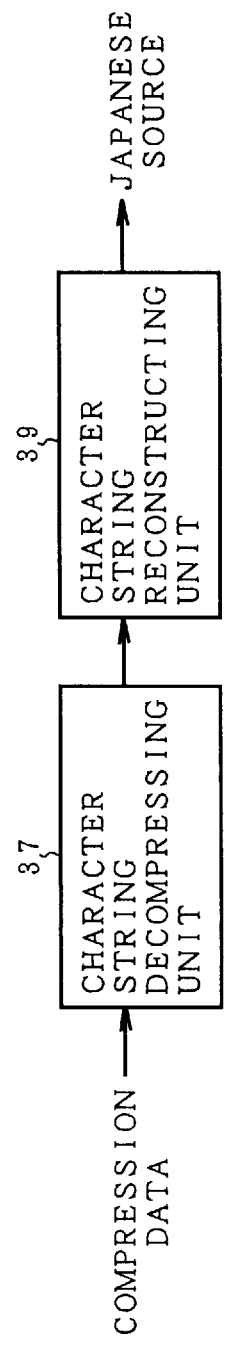
FIG. 36 is a block diagram of a data decompressing apparatus of the invention in which data obtained by compressing the Japanese code as a target by unifying the byte constructions is decompressed.

FIG. 36 shows an embodiment of a data decompressing apparatus for decompressing the original Japanese source data from the compression data derived by the apparatus of FIG. 35. The data decompressing apparatus is constructed by a character string decompressing unit 37 and a character string reconstructing unit 39. The character string decompressing unit 37 decompresses the character string of the unified byte construction from the compression data. The character string reconstructing unit 39 reconstructs the original Japanese source data in which a plurality of kinds of byte constructions mixedly exist from the character string of the unified byte construction which was decompressed.

Figure 37:
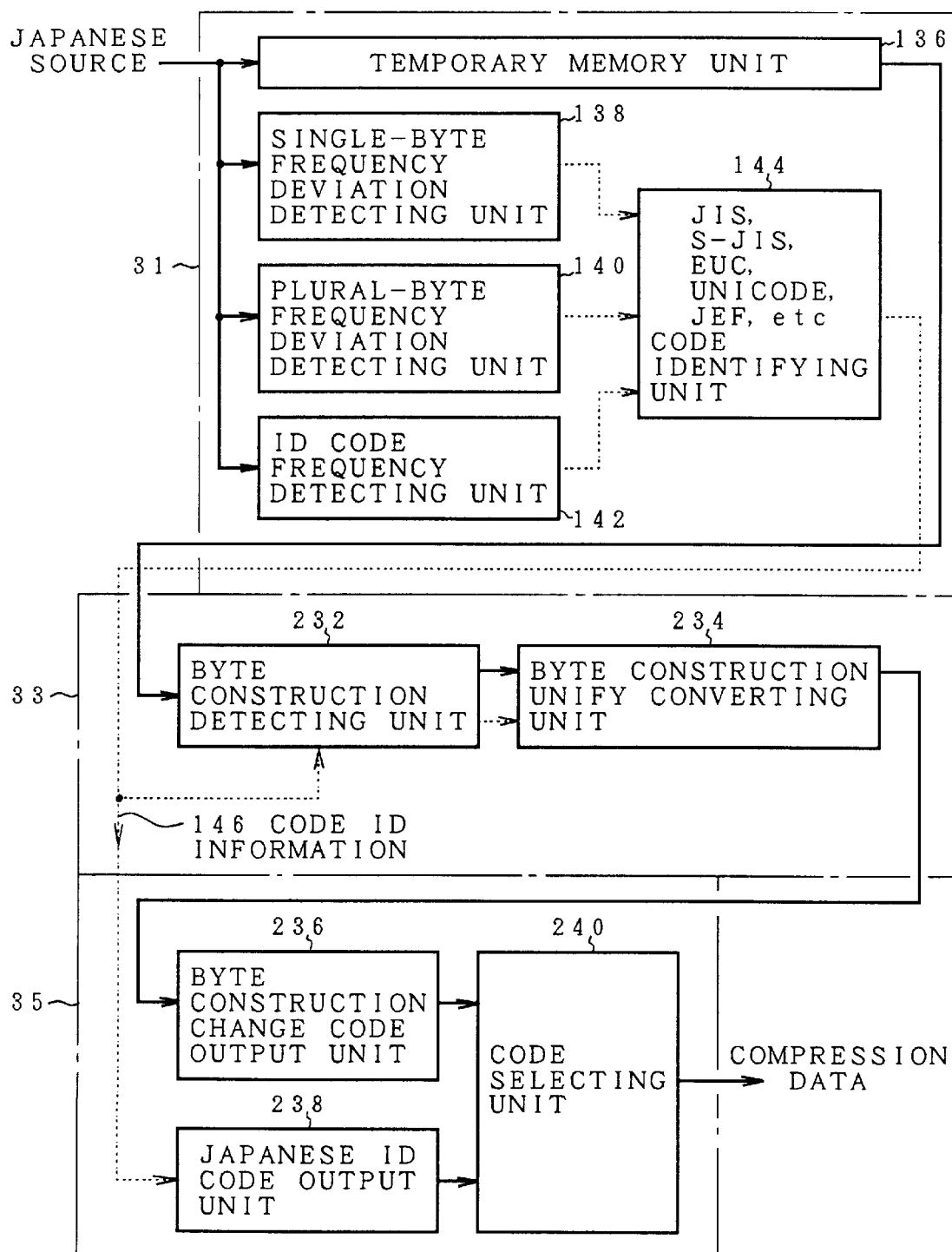
FIG. 37 is a detailed block diagram of the data compressing apparatus of FIG. 35.

FIG. 37 shows a specific embodiment of the data compressing apparatus of FIG. 35. The code kind discriminating unit 31 is the same as the code kind discriminating unit in case of separately compressing every byte construction in FIG. 29 and is designated by the same reference numeral. Subsequent to the code kind discriminating unit 31, the byte construction unifying unit 33 is provided and is constructed by a byte construction detecting unit 232 and a byte construction unify converting unit 234. The byte construction detecting unit 232 discriminates whether each character of the Japanese source data inputted via the temporary memory unit 136 is a single-byte character or a multi-byte character. In each code of JIS, shift JIS, EUC, and further, JEF, since there are the 1-byte construction and the 2-byte construction, the byte construction detecting unit 232 outputs the detection result of the 1-byte construction or the 2-byte construction to the byte construction unify converting unit 234 at the next stage. The byte construction unify converting unit 234 unifies to a character of the maximum number of bytes in the case where the data is constructed by the single-byte construction and the plural-byte construction. For example, in case of the 1-byte construction and the 2-byte construction, if the 1-byte construction is detected, by adding one dummy byte to the character of the 1-byte construction, the character is converted into the character of the 2-byte construction. The dummy byte added to unify the byte construction has a specific bit code which can be clearly distinguished from the character code. Therefore, whether the character has the 2-byte construction or the 1-byte construction can be recognized by checking the presence or absence of the dummy byte. A plural-byte compressing unit 236, a Japanese ID code output unit 238, and a code selecting unit 240 are provided for the character string compressing unit 35 provided subsequent to the byte construction unifying unit 33. The plural-byte compressing unit 236 compresses the character string of the same plural-byte construction outputted from the byte construction unify converting unit 234. The Japanese ID code output unit 238 outputs a Japanese kind code indicative of the Japanese code and the code kind on the basis of the code ID information 146 outputted from the code kind discriminating unit 31. After the Japanese ID code was inserted to the head position, the code selecting unit 240 outputs the compression data which is derived from the plural-byte compressing unit 236 as compression data of one bit stream.

Figure 38A:
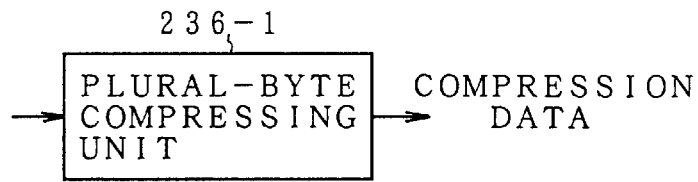
Figure 38B:
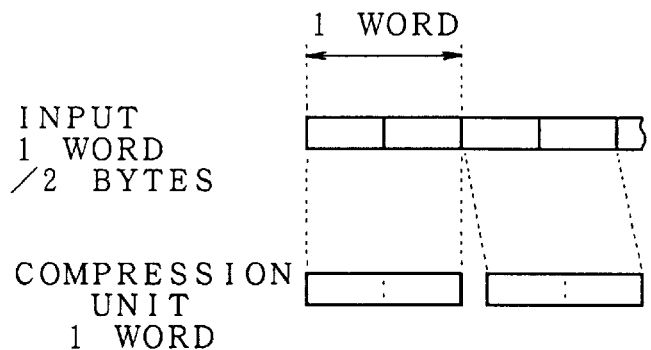
Figure 39A:
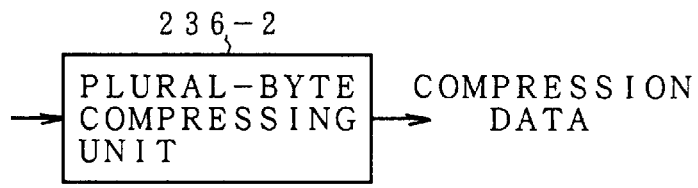
Figure 39B:
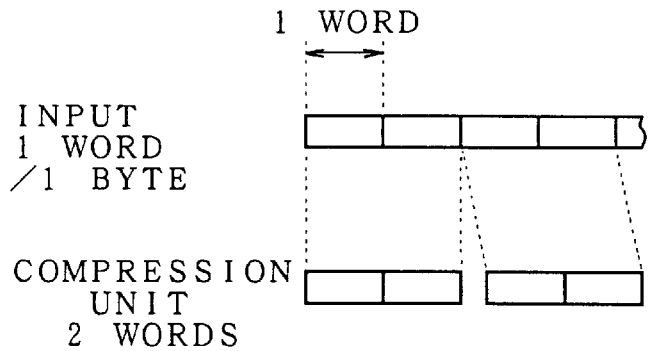

As specific examples of the plural-byte compressing unit 236, there are three kinds of units shown in FIGS. 38A to 38C, 39A to 39C, and 40A to 40C. A plural-byte compressing unit 236-1 in FIG. 38A executes a compression as shown in FIG. 38C with respect to the byte-divided character string in FIG. 38B by setting one character to one word in the case where two bytes are set to one word. A plural-byte compressing unit 236-2 in FIG. 39A relates to the case where one word consists of one byte with respect to the character string of the byte unit in FIG. 39B and compresses the character string on a 2-word unit basis as shown in FIG. 39C. Further, in the case where one word consists of one byte with respect to a character string of a byte unit of FIG. 40B, a plural-byte compressing unit 236-3 in FIG. 40A compresses on a word unit basis as shown in FIG. 40C.

FIG. 41 shows an embodiment of the data decompressing apparatus in FIG. 36 for decompressing the Japanese source data from the compression data compressed by unifying the byte construction. The character string decompressing unit 37 is constructed by a code separating unit 242 and a plural-byte decompressing unit 246. The code separating unit 242 separates the code ID information 244 indicative of the Japanese code and the code kind such as JIS, shift JIS, EUC, or the like from the Japanese ID code inserted to the head of the compression data. A plural-byte decompressing unit 246 decompresses the character string of the unified byte construction from the compression data. As a byte construction decompressing unit 246, any one of decompressing units shown in FIGS. 42A to 42C, FIGS. 43A to 43C, and FIGS. 44A to 44C is used.

A plural-byte decompressing unit 246-1 in FIG. 42A corresponds to the plural-byte compressing unit 236-1 in FIG. 38A. Since the source data to be decompressed relates to one word consisting of two bytes and has been compressed on a word unit basis, after the data was decompressed on a word unit basis in which one word consists of two bytes as shown in FIG. 42B, it is connected to a word unit as shown in FIG. 42C and the resultant data is outputted. A plural-byte decompressing unit 246-2 in FIG. 43A corresponds to the plural-byte compressing unit 236-2 in FIG. 39A. In this case, since the data is compressed on a 2-word unit basis by setting one word to one byte, after similarly decompressing on a 2-word unit basis as shown in FIG. 43B, the data is connected every word as shown in FIG. 43C and the resultant data is outputted. A plural-byte decompressing unit 246-3 in FIG. 44A corresponds to the plural-byte compressing unit 236-3 in FIG. 40A. In this case, since the data has been compressed on a word unit basis by setting one byte to one word, after the data was decompressed on unit basis of one byte and one word as shown in FIG. 44B, the data is connected every word as shown in FIG. 44C and the resultant data is outputted.

Referring again to FIG. 41, a single/plural byte mixture reproducing unit 248 is provided for the character string reconstructing unit 39. The code kind of Japanese is recognized from the code ID information 244 separated by the code separating unit 242. Subsequently, with respect to the decompressed character string of any one of FIGS. 42C, 43C, and 44C decompressed by the plural-byte decompressing unit 246, the presence or absence of the dummy byte is checked on a byte unit basis. If there is dummy byte, by eliminating the dummy byte, the character is converted into the character of the 1-byte construction. Thus, the character string of the Japanese source data in which the single-byte and the plural-byte mixedly exist is decompressed.

FIG. 45 shows processes in the case where the JIS Kanji by the plural-byte compressing unit 236-1 in FIG. 38A is treated as an example and the character of one word constructed by two bytes is registered into the dictionary on a word unit basis and is Ziv-Lempel encoded. FIG. 46 shows processes for the Ziv-Lempel encoding in the case where with respect to the JIS Kanji code, one byte is set to one word and the character is registered on a word unit basis, namely, byte unit basis by the plural-byte compressing unit 236-3 in FIG. 40A in a manner similar to the above. In any of the above cases, since the character string to be compressed has been unified to the 2-byte code, a situation such that the character having inherently the 2-byte construction is meaninglessly divided on a byte unit basis by the mixture with the character of the 1-byte construction and is registered into the dictionary, so that an encoding efficiency deteriorates can be certainly avoided.

According to the invention as described above, for the Unicode or the like in which different languages mixedly exist and which has been internationally standardized, by distinguishing and compressing each language or various characters of different statistic natures in each language, a compressing performance can be further raised. With respect to the Japanese data having different byte constructions or different character kinds, by similarly executing the compression every byte construction or the compression every character kind, the compressing performance can be further raised. For the difference of the byte constructions, by unifying to one byte construction and compressing, the compressing performance can be similarly raised.

What is claimed is:

1. A data compressing apparatus for inputting and compressing a data string in which characters of a plurality of kinds of language codes mixedly exist, comprising:

a language discriminating unit for discriminating the kinds of the language codes which are inputted;

a language string separating unit for separating said data string into a language string for each of said languages discriminated by said language discriminating unit; and a language string compressing unit for individually compressing each of said language strings separated by said language string separating unit.

2. An apparatus according to claim 1, wherein said character code system is a Unicode system which has a 2-dimensional code space of a column octet and a row octet and in which one character is expressed by a character code of at least two bytes of the column octet of lower one byte and a row octet of upper one byte and different character code spaces are allocated every said plurality of kinds of languages by said row octet, said language discriminating unit discriminates the kind of language from the row octet of each character code and forms language change information, and said language string separating unit separates the character code of two bytes which is determined by said discriminated kind of language and constructs a language string of each language.

3. A data decompressing apparatus for inputting a data string in which characters of a plurality of kinds of language codes mixedly exist, discriminating kinds of said language codes, and decompressing the original data string from compressed data which is obtained by separating said data string into a language string of each of said discriminated languages and, thereafter, by individually compressing said language string and language change information formed at the time of said compression, comprising:

a language string decompressing unit for decompressing the language string on each language unit basis from said compressed data; and a language string reconstructing unit for decompressing the data string in which said plurality of kinds of language codes mixedly exist from each of said language strings which were decompressed by said language string decompressing unit and said language change information.

4. An apparatus according to claim 3, wherein said character code system is a Unicode system which has a 2-dimensional code space of a column octet and a row octet and in which one character is expressed by a character code of at least two bytes of the column octet of lower one byte and a row octet of upper one byte and, further, different character code spaces are allocated every said plurality of kinds of languages by said row octet.

5. A data compressing apparatus for inputting and compressing a data string of different kinds of character codes in which one character code is constructed by different number of bytes, comprising:

a code kind discriminating unit for discriminating a kind of said character code to which said input data string belongs and outputting code of or a kind of ID information;

a separating unit for detecting a byte construction of each character code of said input data string on the basis of said code of ID information and separating into a plurality of kinds of character strings of different byte constructions; and a character string compressing unit for individually compressing the plurality of kinds of character strings with the different byte constructions which were separated by said character string separating unit.

6. An apparatus according to claim 5, wherein:

said data string is a data string of any one of said plurality of kinds of character codes allocated to a 2-dimensional character code space which is defined by an upper byte and a lower byte;

said code discriminating unit comprises a temporary memory unit for storing data in a predetermined interval of said data string, a first frequency detecting unit for detecting a frequency distribution of 1-byte character in said character code space with respect to the data stored in said temporary memory unit, a second frequency detecting unit for detecting a frequency distribution of a plurality of byte characters in said character code space with respect to the data stored in said temporary memory unit;

a third frequency detecting unit for detecting a frequency distribution of an ID character code which is used in each of said plurality of kinds of character codes, and an identifying unit for identifying the kind of the character code of said data string on the basis of a deviation of the frequency distributions in said character code spaces by said three frequency detecting units;

said byte construction separating unit comprises a byte construction detecting unit for separating said data string on a byte unit basis, detecting whether said data string has a 1-byte construction or a plural-byte construction, and outputting byte construction detection information, and a character string separating unit for separating said data string into a character string with the 1 byte construction and a character string with the plural-byte construction on the basis of said byte construction detection information; and said character string compressing unit comprises a single-byte compressing unit for compressing the character string with the 1-byte construction, a plural-byte compressing unit for compressing the character string with the plural-byte construction, a character code ID information output unit for outputting code ID information indicative of the kind of the character code in accordance with said code kind ID information, a byte construction change output unit for outputting byte construction change information indicative of a change in byte construction on the basis of said byte construction detection information; and a code selecting unit for selectively synthesizing said character code ID information, said byte construction change information, said single-byte compressed data, and said plural-byte compressed data and outputting resultant synthesized data.

7. An apparatus according to claim 5, wherein a JIS code, a shift JIS code, an EUC code, a Unicode, and a JEF code are allocated as a plurality of character codes into a character code space.

8. A data decompressing apparatus for decompressing an original character string from compressed data obtained in a manner such that a data string of different kinds of character codes in which one character code is constructed by different number of bytes is inputted, a kind of character code to which said input data string belongs is discriminated, a code of or a kind of ID information is outputted, a byte construction of each character code of said input data string is detected, said data string is separated into a plurality of kinds of character strings of different byte constructions, and further said separated plurality of kinds of character strings of the different byte constructions are individually compressed, thereby obtaining the compressed data, comprising:

a character string decompressing unit for separating the compressed data every byte construction and individually decompressing said character strings; and a character string reconstructing unit for coupling said character strings with the different byte constructions which were decompressed by said character string decompressing unit into one character string, thereby reconstructing the original character string.

9. An apparatus according to claim 8, wherein:

said compressed data is constructed by single-byte compressed data obtained by compressing the character string of a 1-byte construction, plural-byte compressed data obtained by compressing the character code string of a plural-byte construction, code ID information indicative of the kind of the character code, and byte construction change information indicative of a change of the byte construction;

said character string decompressing unit comprises a code separating unit for separating said single byte compressed data, said plural-byte compressed data, said code ID information, and said byte construction change information, a single-byte decompressing unit for decompressing the character string of the single-byte construction from the single-byte compressed data separated by said code separating unit, and a plural-byte decompressing unit for decompressing the character string of the plural-byte construction from the plural-byte compressed data separated by said code separating unit; and said character string reconstructing unit decompresses the original character code string by coupling the decompressed character string of the single-byte construction and the decompressed character string of the plural-byte construction on the basis of the code ID information and the byte construction change information which were separated by said code separating unit.

10. An apparatus according to claim 8, wherein a JIS code, a shift JIS code, an EUC code, a Unicode, and a JEF code are allocated as a plurality of character codes into a character code space.

11. A data compressing apparatus for inputting and compressing a data string of different kinds of character codes in which a character code of one character is constructed by a different number of bytes, comprising:

a code kind discriminating unit for discriminating the kind of the character code to which said input data string belongs and outputting code kind ID information;

a character kind separating unit for detecting a character kind of each character code of said data string on the basis of said code kind ID information and separating into a character string of each different character kind; and a character string compressing unit for individually compressing each character string of each different character kind which was separated by said character kind separating unit.

12. An apparatus according to claim 11, wherein:

said data string is a data string of any one of said plurality of kinds of character codes allocated to a 2-dimensional character code space which is defined by an upper byte and a lower byte;

said code kind discriminating unit comprises a temporary memory unit for storing the data in a predetermined interval of said data string, a first frequency detecting unit for detecting a frequency distribution of a 1-byte character in said code space with respect to the data stored in said temporary memory unit, a second frequency detecting unit for detecting a frequency distribution of a plural-byte character in said character code space with respect to the data stored in said temporary memory unit, a third frequency detecting unit for detecting a frequency distribution of the ID character code which is used in each of said plurality of kinds of character codes, and an identifying unit for identifying the kind of the character code of said data string on the basis of a deviation of the frequency distributions in said character code space by said three frequency detecting units;

said character kind separating unit comprises a character kind detecting unit for separating said data string on a byte unit basis, detecting the character kind, and outputting character kind detection information, and a character string separating unit for separating the character string every said character kind on the basis of said character kind detection information; and said character string compressing unit comprises a plurality of character kind compressing unit each of which is provided for every said character kind, a character code ID information output unit for outputting character code ID information indicative of the character kind of the character code in accordance with said character kind ID information, character kind change information output unit for outputting character kind change information indicative of a change in character kind, and a code selecting unit for selectively synthesizing said character code ID information, said character kind change information, and said compressed data of each of said character kinds and outputting resultant synthesized data.

13. An apparatus according to claim 11, wherein a JIS code, a shift JIS code, an EUC code, a Unicode, and a JEF code are allocated as a plurality of character codes into a character code space.

14. A data decompressing apparatus for decompressing an original character string from compressed data which is obtained in a manner such that a data string of different kinds of character codes in which the character code of one character is constructed by a different number of bytes is separated into character code strings of different character kinds on the basis of code kind ID information indicative of the character code kind and, after that, said character code strings are individually compressed, comprising:

a character string decompressing unit for separating said compressed data every said character kind and individually decompressing the character string of every said character kind; and a character string reconstructing unit for coupling the character strings of different character kinds which were decompressed by said character string decompressing unit into one character string, thereby reconstructing the original character string.

15. An apparatus according to claim 14, wherein:

said compressed data is constructed by character kind compressed data obtained by separating the character string of a 1-byte construction every said character kind and individually compressing said character strings, code ID information indicative of the kind of said character code, and character kind change information indicative of a change in character kind;

said character string decompressing unit comprises a code separating unit for separating the compressed data of every said character kind, said code ID information, and said character kind change information, and a character kind decompressing unit for decompressing the character string every character kind from the compressed data of every said character kind separated by said code separating unit; and said character string reconstructing unit reproduces the original character string by coupling the character strings decompressed every said character kind on the basis of the code ID information and the character kind change information which were separated by said code separating unit.

16. An apparatus according to claim 14, wherein a JIS code, a shift JIS code, an EUC code, a Unicode, and a JEF code are allocated as a plurality of character codes into a character code space.

17. A data compressing apparatus for inputting and compressing a data string of different kinds of character codes in which the character code of one character is constructed by a different number of bytes, comprising:

a code kind discriminating unit for discriminating the kind of the character code to which said input data string belongs and outputting code kind ID information;

a byte construction unifying unit for detecting the byte construction of each character of said data string on the basis of said code kind ID information and unifying characters of different byte constructions to a character of one byte construction; and a character string compressing unit for compressing the character strings of the same byte construction which were unified by said byte construction unifying unit.

18. An apparatus according to claim 17, wherein:

said data string is a data string of any one of the plurality of kinds of character codes allocated into a 2-dimensional character code space which is defined by an upper byte and a lower byte;

said code kind discriminating unit comprises a temporary memory unit for storing the data in a predetermined interval of said data string, a first frequency detecting unit for detecting a frequency distribution of a 1-byte character in said character code space with respect to the data stored in said temporary memory unit, a second frequency detecting unit for detecting a frequency distribution of a plural-byte character in said character code space with respect to the data stored in said temporary memory unit;

a third frequency detecting unit for detecting a frequency distribution of an ID code which is used in each of said plurality of kinds of character codes, and an identifying unit for identifying the character code kind of said data string on the basis of a deviation of the frequency distributions in said character code spaces by said three frequency detecting units;

said byte construction unifying unit comprises a byte construction detecting unit for separating said data string on a byte unit basis and detecting whether the character is the 1-byte character or the plural-byte character, and a byte construction converting unit for adding a dummy byte to the character of the 1-byte construction detected by said byte construction detecting unit and unifying the resultant data to the character of the plural-byte construction; and said character string compressing unit comprises a character code ID information output unit for outputting character code ID information indicative of the kind of the character code in accordance with said code kind ID information, a plural-byte compressing unit for compressing the character string of the plural-byte construction, and a code selecting unit for selectively synthesizing said character code ID information and said plural-byte compressed data and outputting resultant synthesized data.

19. An apparatus according to claim 17, wherein a JIS code, a shift JIS code, an EUC code, a Unicode, and a JEF code are allocated as a plurality of character codes into a character code space.

20. A data decompressing apparatus for decompressing an original character string from compressed data which is obtained in a manner such that a character of a different byte construction is converted into characters of one byte construction on the basis of a character code kind of a data string of different kinds of character codes in which the character code of one character is constructed by a different number of bytes, the converted characters are unified, and after that, the unified character is compressed, comprising:

a character string decompressing unit for decompressing the character code string of the unified byte construction from said compressed data; and a character string reconstructing unit for reconstructing the character strings of the unified byte construction which were decompressed by said character string decompressing unit into character strings of different byte constructions.

21. An apparatus according to claim 20, wherein:

said compressed data is constructed by unified byte compressed data obtained by compressing the character code strings of the unified byte construction and code ID information indicative of the kind of said character code;

said character string decompressing unit comprises a code separating unit for separating said plural byte compressed data and said code ID information, and a plural-byte decompressing unit for decompressing the character string of the unified byte construction from the unified byte compressed data separated by said code separating unit; and said character string reconstructing unit decompresses the character code string in which the character code of a single-byte construction and the character code of a plural-byte construction mixedly exist on the basis of the code ID information separated by said code separating unit.

22. An apparatus according to claim 20, wherein a JIS code, a shift JIS code, an EUC code, a Unicode, and a JEF code are allocated as a plurality of character codes into a character code space.

* * * * *